United States Patent
Miyanami

(10) Patent No.: US 9,202,839 B2
(45) Date of Patent: Dec. 1, 2015

(54) SOLID-STATE IMAGING DEVICE, METHOD FOR MANUFACTURING THE SAME, AND ELECTRONIC APPARATUS TO FORM HIGH-CONCENTRATION IMPURITY REGION IN SEMICONDUCTOR SUBSTRATE

(75) Inventor: Yuki Miyanami, Kanagawa (JP)

(73) Assignee: Sony Corporation, Tokyo (JP)

( * ) Notice: Subject to any disclaimer, the term of this patent is extended or adjusted under 35 U.S.C. 154(b) by 539 days.

(21) Appl. No.: 13/527,713

(22) Filed: Jun. 20, 2012

(65) Prior Publication Data

US 2013/0001730 A1 Jan. 3, 2013

(30) Foreign Application Priority Data

Jun. 28, 2011 (JP) ................................. 2011-143581

(51) Int. Cl.
*H01L 27/00* (2006.01)
*H01L 27/146* (2006.01)

(52) U.S. Cl.
CPC ...... *H01L 27/1464* (2013.01); *H01L 27/14603* (2013.01); *H01L 27/14643* (2013.01); *H01L 27/14687* (2013.01); *H01L 27/14689* (2013.01); *H01L 27/14647* (2013.01)

(58) Field of Classification Search
CPC .................. H01L 27/14647; H01L 27/14603; H01L 27/14643; H01L 27/14687; H01L 27/14689
See application file for complete search history.

(56) References Cited

U.S. PATENT DOCUMENTS

| 6,930,336 B1 * | 8/2005 | Merrill .......................... 257/292 |
| 2011/0019042 A1 * | 1/2011 | Yamaguchi ................... 348/280 |

FOREIGN PATENT DOCUMENTS

| JP | 2006-22278 | 8/2006 |
| JP | 2006-278446 | 10/2006 |
| JP | 2011-029337 | 2/2011 |

* cited by examiner

*Primary Examiner* — Kimberly Rizkallah
*Assistant Examiner* — Alexander Belousov
(74) *Attorney, Agent, or Firm* — Sony Corporation

(57) ABSTRACT

A solid-state imaging device includes a semiconductor substrate, a connection portion, and one or more first photoelectric conversion units formed in the semiconductor substrate. The semiconductor substrate has a back side and a front side. The back side is a light incident surface, and the front side is a circuit-forming surface. The connection portion is connected to a contact plug that transfers signal charges generated on the back side of the semiconductor substrate into the semiconductor substrate. The connection portion has a peak of an impurity concentration distribution near an interface of the semiconductor substrate on the back side of the semiconductor substrate.

6 Claims, 18 Drawing Sheets

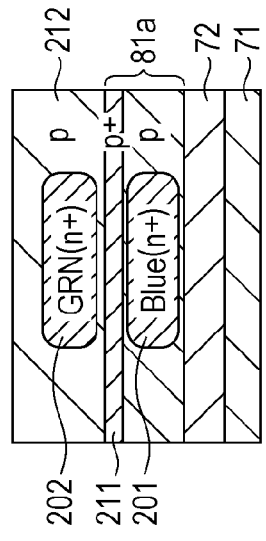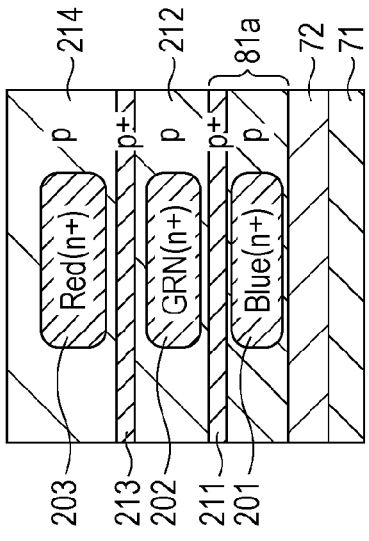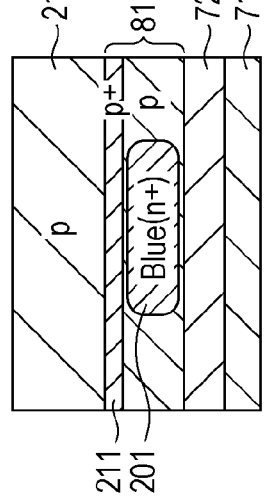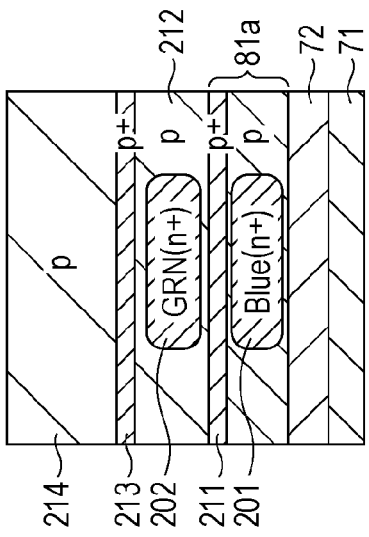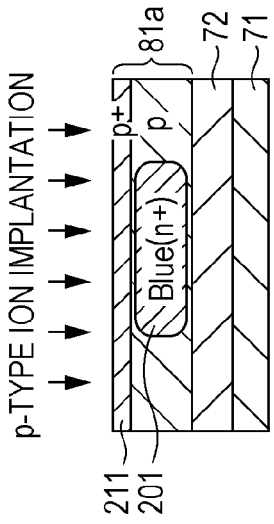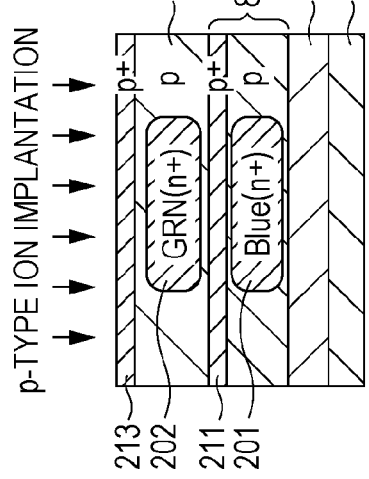

SOLID-STATE IMAGING DEVICE, METHOD FOR MANUFACTURING THE SAME, AND ELECTRONIC APPARATUS TO FORM HIGH-CONCENTRATION IMPURITY REGION IN SEMICONDUCTOR SUBSTRATE

BACKGROUND

The present technology relates to solid-state imaging devices, methods for manufacturing the same, and electronic apparatuses, and more specifically to a solid-state imaging device, a method for manufacturing the same, and an electronic apparatus in which a high-concentration impurity region can be formed in a semiconductor substrate and on the back side of the semiconductor substrate.

In general, charge coupled device (CCD) and complementary metal oxide semiconductor (CMOS) image sensors of the related art have a configuration in which pixels of colors of green, red, and blue are arranged on a plane and a photoelectric conversion signal of green, red, or blue is obtained from each pixel. Examples of patterns of green, red, and blue pixels include a Bayer pattern of pixels in blocks of four pixels having two green pixels, one red pixel, and one blue pixel.

In the CCD and CMOS image sensors of the related art, therefore, a single-color signal is obtained from each pixel. Thus, it is necessary to perform signal processing called demosaicing processing on, for example, a green pixel to interpolate blue and red signals from signals of the adjacent blue and red pixels. However, such signal processing leads to a degradation in image quality called false color. In order to prevent the degradation in image quality caused by false color, it is desirable that three photoelectric conversion layers be stacked vertically on top of one another so that photoelectric conversion signals of three colors may be obtained from one pixel.

Therefore, an image sensor is available in which, for example, photoelectric conversion films of green, red, and blue are stacked on top of one another on a semiconductor substrate so that photoelectric conversion signals of green, red, and blue can be obtained with one pixel (see, for example, Japanese Unexamined Patent Application Publication No. 2006-222278).

There is another image sensor in which a photoelectric conversion film of one color (green) is formed on a semiconductor substrate and photoelectric conversion units of two colors (blue, red) are formed in a semiconductor layer so that photoelectric conversion signals of green, red, and blue can be obtained with one pixel (see, for example, Japanese Unexamined Patent Application Publication No. 2006-278446).

The technologies described above provide a structure in which photoelectric conversion layers are stacked on top of one another on a front surface of a semiconductor substrate on which wiring is formed ("front-illuminated multilayer image sensor"), and have a feature in that signal charges in the stacked photoelectric conversion layers are temporarily accumulated in the semiconductor layer. If light enters a semiconductor region where the signal charges obtained in the stacked photoelectric conversion layers are accumulated, signals having components other than the components in the photoelectric conversion layers may be contained in photoelectric conversion signals in the semiconductor region, and color mixture may occur. In such a stacked image sensor as above, therefore, it is necessary to form a light-shielding layer to prevent light from leaking in the semiconductor region where signals from the stacked photoelectric conversions are accumulated.

In the front-illuminated multilayer image sensor described above, however, it is difficult to realize a light-shielding layer. Therefore, a back-illuminated image sensor having a structure in which a photoelectric conversion layer for one color which is formed of an organic photoelectric conversion film is stacked on a semiconductor substrate and photoelectric conversion layers for two colors are stacked on top of each other in the semiconductor substrate has been proposed by the present assignee (see, for example, Japanese Unexamined Patent Application Publication No. 2011-29337). In this structure, it is necessary to form a high-concentration impurity region near the interface of the semiconductor substrate and on the back side of the semiconductor substrate to obtain ohmic contact with a contact plug for extracting signal charges from the organic photoelectric conversion film.

SUMMARY

However, it is difficult to form a high-concentration impurity region because the back side of the semiconductor substrate is a region deep in the semiconductor layer in the manufacturing process.

It is therefore desirable to provide a technology capable of forming a high-concentration impurity region in a semiconductor substrate on a back side of the semiconductor substrate.

In a first embodiment of the present technology, a solid-state imaging device includes a semiconductor substrate, a connection portion, and one or more first photoelectric conversion units formed in the semiconductor substrate. The semiconductor substrate has a back side and a front side. The back side is a light incident surface, and the front side is a circuit-forming surface. The connection portion is connected to a contact plug that transfers signal charges generated on the back side of the semiconductor substrate into the semiconductor substrate. The connection portion has a peak of an impurity concentration distribution near an interface of the semiconductor substrate on the back side of the semiconductor substrate.

In the solid-state imaging device according to the first embodiment of the present technology, signal charges generated on the back side of the semiconductor substrate are transferred to a connection portion in the semiconductor substrate which is connected to a contact plug. In the connection portion, an impurity concentration distribution exhibits a peak near the interface of the semiconductor substrate on the back side of the semiconductor substrate.

In a second embodiment of the present technology, a method for manufacturing a solid-state imaging device includes forming a connection portion by ion-implanting impurities into a first region of a semiconductor substrate having a first thickness, the connection portion being connected to a contact plug that transfers signal charges generated on a back side of the semiconductor substrate into the semiconductor substrate, the back side of the semiconductor substrate being a light incident surface, the connection portion having a peak of an impurity concentration distribution near an interface of the semiconductor substrate on the back side of the semiconductor substrate; performing epitaxial growth to increase the thickness of the semiconductor substrate having the first thickness to a second thickness; forming a first photoelectric conversion layer in a second region at a horizontal position different from a horizontal position of the connection portion in the semiconductor substrate having the second thickness, the first photoelectric conversion layer being configured to photoelectrically convert light having a first wavelength; and further performing epitaxial growth to increase the thickness of the semiconductor substrate having the second thickness to a third thickness.

In the method according to the second embodiment of the present technology, a connection portion is formed by ion-implanting impurities into a first region of a semiconductor substrate having a first thickness, the connection portion being connected to a contact plug that transfers signal charges generated on a back side of the semiconductor substrate into the semiconductor substrate, the back side of the semiconductor substrate being a light incident surface, the connection portion having a peak of an impurity concentration distribution near the interface of the semiconductor substrate on the back side of the semiconductor substrate; epitaxial growth is performed to increase the thickness of the semiconductor substrate having the first thickness to a second thickness; a first photoelectric conversion layer is formed in a second region at a horizontal position different from a horizontal position of the connection portion in the semiconductor substrate having the second thickness, the first photoelectric conversion layer being configured to photoelectrically convert light having a first wavelength; and epitaxial growth is further performed to increase the thickness of the semiconductor substrate having the second thickness to a third thickness.

In a third embodiment of the present technology, an electronic apparatus includes a solid-state imaging device and a signal processing circuit. Light collected by an optical lens enters the solid-state imaging device. The signal processing circuit processes an output signal of the solid-state imaging device. The solid-state imaging device includes a semiconductor substrate, a connection portion, and one or more first photoelectric conversion units formed in the semiconductor substrate. The semiconductor substrate has a back side and a front side. The back side is a light incident surface, and the front side is a circuit-forming surface. The connection portion is connected to a contact plug that transfers signal charges generated on the back side of the semiconductor substrate into the semiconductor substrate. The connection portion has a peak of an impurity concentration distribution near an interface of the semiconductor substrate on the back side of the semiconductor substrate.

In the electronic apparatus according to the third embodiment of the present technology, light collected by the optical lens enters the solid-state imaging device, and an output signal of the solid-state imaging device is processed by the signal processing circuit. In the solid-state imaging device, signal charges generated on the back side of the semiconductor substrate are transferred to a connection portion in the semiconductor substrate which is connected to a contact plug. In the connection portion, an impurity concentration distribution exhibits a peak near the interface of the semiconductor substrate on the back side of the semiconductor substrate.

According to the first to third embodiments of the present technology, a high-concentration impurity region can be formed in a semiconductor substrate and on the back side of the semiconductor substrate.

BRIEF DESCRIPTION OF THE DRAWINGS

FIGS. 17A to 17F are diagrams illustrating a first manufacturing method for forming three photoelectric conversion layers;

DETAILED DESCRIPTION OF EMBODIMENTS

Figure 1:
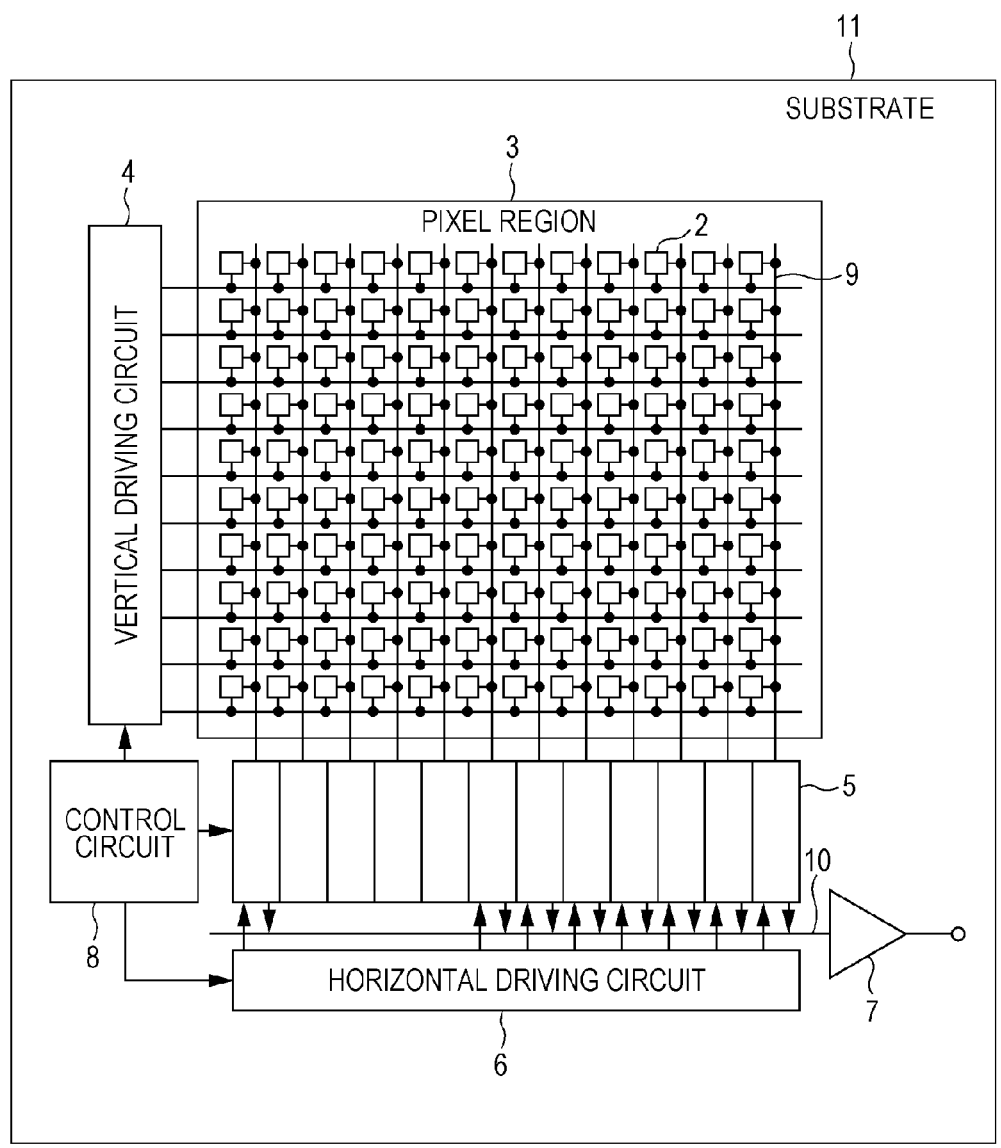
FIG. 1 is a schematic configuration diagram illustrating an overall configuration of a solid-state imaging device according to a first embodiment of the present technology.

Embodiments of the present technology will be described hereinafter. The description will be made in the following order:
1. First embodiment: Solid-state imaging device
　1-1 Overall configuration
　1-2 Schematic plan view configuration of pixel
　1-3 Schematic cross-sectional configuration of pixel
　1-4 Problems with related art
　1-5 First manufacturing method 1-6 Second manufacturing method
　1-7 Third manufacturing method
　1-8 Fourth manufacturing method
　1-9 Manufacturing process of back side of semiconductor substrate
　1-10 Driving method
2. Second embodiment: Example of forming photoelectric conversion units for three colors in semiconductor layer
3. Third embodiment: Electronic apparatus 1. First Embodiment First, a description will be made of a solid-state imaging device according to a first embodiment of the present technology.
1-1 Overall Configuration of Solid-State Imaging Device FIG. 1 is a schematic configuration diagram illustrating an overall configuration of a solid-state imaging device 1 according to the first embodiment. The solid-state imaging device 1 illustrated in FIG. 1 is a back-illuminated CMOS solid-state imaging device.

The solid-state imaging device 1 illustrated in FIG. 1 includes, for example, a pixel region 3 having a plurality of pixels 2 arranged on a substrate 11 composed of silicon, a vertical driving circuit 4, column signal processing circuits 5, a horizontal driving circuit 6, an output circuit 7, and a control circuit 8.

Each of the pixels 2 includes a photodiode serving as a photoelectric conversion element, and a plurality of pixel transistors, and the plurality of pixels 2 are regularly arranged in a two-dimensional array on the substrate 11. The pixel transistors of each of the pixels 2 may be four pixel transistors including a transfer transistor, a reset transistor, a selection transistor, and an amplification transistor, or may be three transistors including a transfer transistor, a reset transistor, and an amplification transistor.

The pixel region 3 has the plurality of pixels 2 that are regularly arranged in a two-dimensional array. The pixel region 3 includes an effective pixel region (not illustrated) that actually receives light, amplifies the signal charges generated through photoelectric conversion, and reads the amplified signal charges to the column signal processing circuits 5, and a black reference pixel region (not illustrated) for outputting an optical black on which the black level is based. The black reference pixel region is generally formed in the periphery of the effective pixel region.

The control circuit 8 generates a clock signal, a control signal, and the like, which the operations of the vertical driving circuit 4, the column signal processing circuits 5, the horizontal driving circuit 6, etc., are based on, in accordance with a vertical synchronization signal, a horizontal synchronization signal, and a master clock. The clock signal, the control signal, and the like generated by the control circuit 8 are input to the vertical driving circuit 4, the column signal processing circuits 5, the horizontal driving circuit 6, etc.

The vertical driving circuit 4 is formed of, for example, a shift register, and selectively scans the pixels 2 in the pixel region 3 row by row sequentially in the vertical direction. Further, the vertical driving circuit 4 supplies pixel signals based on the signal charges generated in accordance with the amounts of light received by the respective photodiodes of the pixels 2 to the column signal processing circuits 5 through vertical signal lines 9.

The column signal processing circuits 5 are arranged in, for example, columns of the pixels 2, and perform signal processing, such as noise removal or reduction and signal amplification, on signals output from every row of pixels of the pixels 2 on a column-by-column basis in accordance with a signal from the black reference pixel region (which is formed so as to surround the effective pixel region although not illustrated). Horizontal selection switches (not illustrated) are provided at the output stages of the column signal processing circuits 5 between a horizontal signal line 10 and the column signal processing circuits 5.

The horizontal driving circuit 6 is formed of, for example, a shift register. The horizontal driving circuit 6 sequentially outputs horizontal scanning pulses to select the column signal processing circuits 5 in sequence, and causes a pixel signal to be output from each of the column signal processing circuits 5 to the horizontal signal line 10.

The output circuit 7 performs signal processing on the signals sequentially supplied from the column signal processing circuits 5 through the horizontal signal line 10, and outputs the resulting signals.

1-2 Schematic Plan View Configuration of Pixel 2

Figure 2:
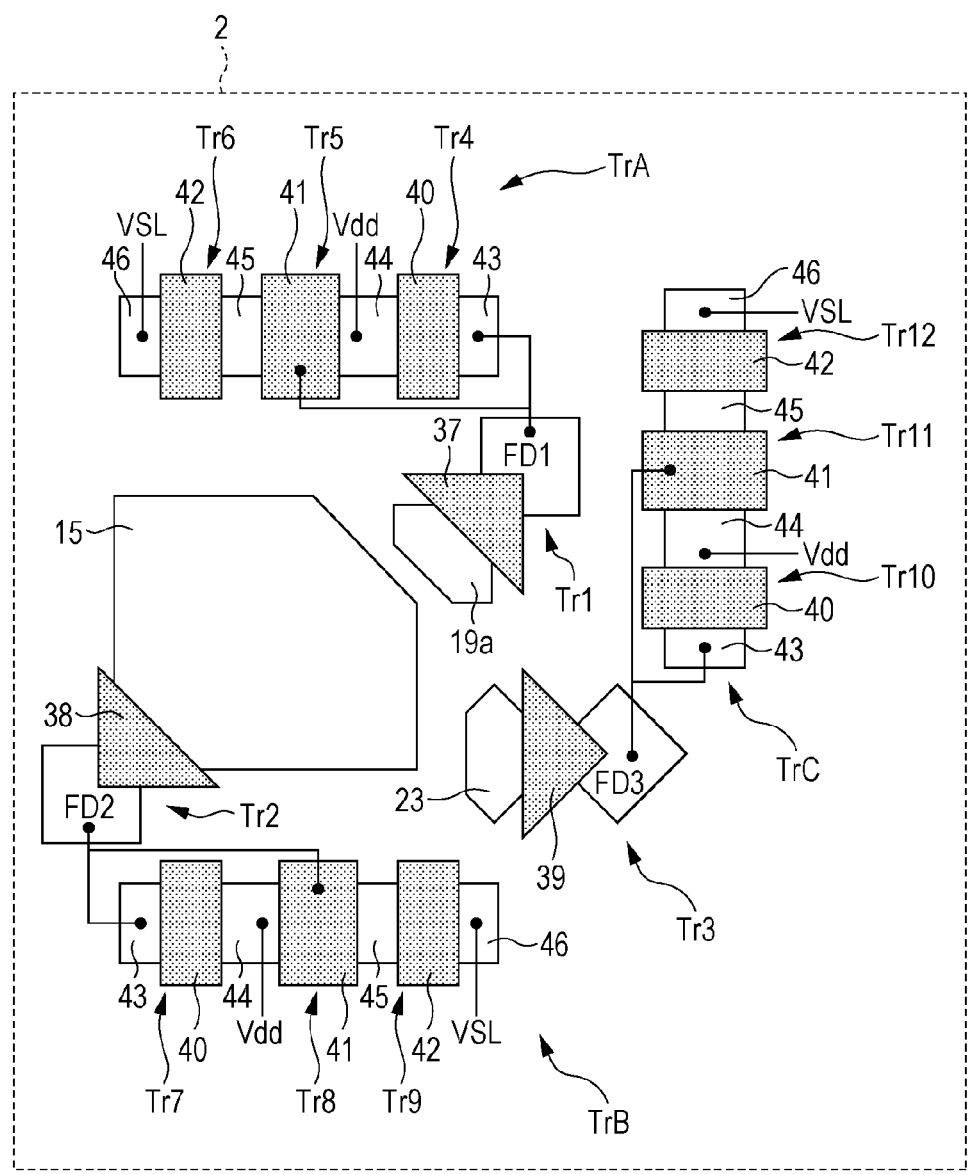
FIG. 2 is a schematic plan view of a pixel of the solid-state imaging device illustrated in FIG. 1.

FIG. 2 illustrates a schematic plan view configuration of each of the pixels 2 of the solid-state imaging device 1. As illustrated in FIG. 2, each of the pixels 2 includes a photoelectric conversion region 15 where three-layer, first to third photoelectric conversion units for photoelectrically converting light having wavelengths of red ("Red"), green ("GRN"), and blue ("Blue") are stacked on top of one another, and charge readout units individually corresponding to the first to third photoelectric conversion units. In this embodiment, the charge readout units are formed of first, second, and third pixel transistors TrA, TrB, and TrC corresponding to the first, second, and third photoelectric conversion units, respectively. In the solid-state imaging device 1 according to this embodiment, spectral separation is vertically performed in the pixels 2.

The first, second, and third pixel transistors TrA, TrB, and TrC are formed around the photoelectric conversion region 15, and each of the first, second, and third pixel transistors TrA, TrB, and TrC includes four metal-oxide semiconductor (MOS) transistors. The first pixel transistor TrA is configured to output, as a pixel signal, the signal charges generated by and accumulated in the first photoelectric conversion unit, which will be described below, and includes a first transfer transistor Tr1, a reset transistor Tr4, an amplification transistor Tr5, and a selection transistor Tr6. The second pixel transistor TrB is configured to output, as a pixel signal, the signal charges generated by and accumulated in the second photoelectric conversion unit, which will be described below, and includes a second transfer transistor Tr2, a reset transistor Tr7, an amplification transistor Tr8, and a selection transistor Tr9. The third pixel transistor TrC is configured to output, as a pixel signal, the signal charges generated by and accumulated in the third photoelectric conversion unit, which will be described below, and includes a third transfer transistor Tr3, a reset transistor Tr10, an amplification transistor Tr11, and a selection transistor Tr12.

Each of the reset transistors Tr4, Tr7, and Tr10 includes source-drain regions 43 and 44 and a gate electrode 40. Each of the amplification transistors Tr5, Tr8, and Tr11 includes source-drain regions 44 and 45 and a gate electrode 41. Each of the selection transistors Tr6, Tr9, and Tr12 includes source-drain regions 45 and 46 and a gate electrode 42. In the pixel transistors TrA, TrB, and TrC, floating diffusion portions FD1, FD2, and FD3 are connected to the source-drain regions 43 of the reset transistors Tr4, Tr7, and Tr10, respectively. The floating diffusion portions FD1, FD2, and FD3 are further connected to the gate electrodes 41 of the amplification transistors Tr5, Tr8, and Tr11, respectively. Further, power supply voltage wiring Vdd is connected to the source-drain region 44 shared by the reset transistors Tr4, Tr7, and Tr10 and the amplification transistors Tr5, Tr8, and Tr11. Further, selection signal wiring VSL is connected to the source-drain regions 46 of the selection transistors Tr6, Tr9, and Tr12.

1-3 Schematic Cross-Sectional Configuration of Pixel 2

Figure 3:
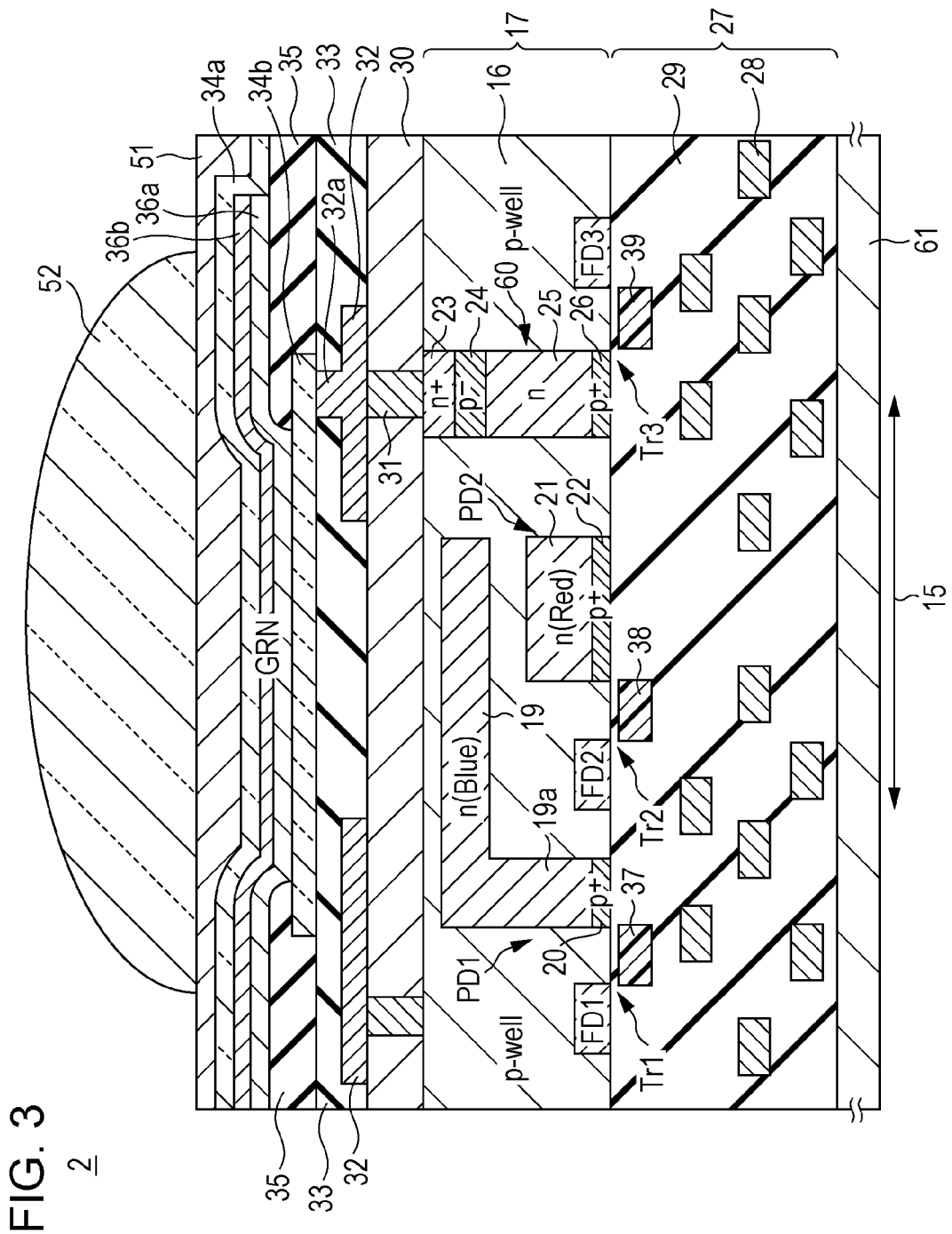
FIG. 3 is a schematic cross-sectional view of a main portion of the pixel.

FIG. 3 illustrates a schematic cross-sectional configuration of each of the pixels 2 of the solid-state imaging device 1. In FIG. 3, only the first, second, and third transfer transistors Tr1, Tr2, and Tr3 in the first, second, and third pixel transistors TrA, TrB, and TrC are illustrated, and the illustration of the other pixel transistors is omitted.

The solid-state imaging device 1 according to this embodiment is a back-illuminated solid-state imaging device in which light enters from a back side opposite to a front side of a semiconductor substrate 17 on which the respective pixel transistors are formed. In FIG. 3, the upper side is the back side, which is a light receiving surface side (light incident surface side), and the lower side is the front side, which is a circuit-forming surface on which pixel transistors and peripheral circuits such as logic circuits are formed.

The photoelectric conversion region 15 is configured such that first and second photoelectric conversion units formed of first and second photodiodes PD1 and PD2 which are formed in the semiconductor substrate 17, and a third photoelectric conversion unit formed of an organic photoelectric conversion film 36a which are formed on the back side of the semiconductor substrate 17 are stacked on top of each other in the light incident direction.

The first and second photodiodes PD1 and PD2 are formed in a well region 16 formed of a first-conductivity-type (in this embodiment, p-type) semiconductor region of the semiconductor substrate 17 which is composed of silicon. The first photodiode PD1 has an n-type semiconductor region 19 that is formed on the light receiving surface side of the semiconductor substrate 17 and that contains second-conductivity-type (in this embodiment, n-type) impurities, and an extending portion 19a having a portion that extends so as to reach the front side of the semiconductor substrate 17. The extending portion 19a is formed around the photoelectric conversion region 15 formed of a portion where the three-layer photoelectric conversion units are stacked on top of one another, and a high-concentration p-type semiconductor region 20 serving as a hole accumulation layer is formed on a surface of the extending portion 19a (or on the front surface of the semiconductor substrate 17). The extending portion 19a is formed as an extraction layer for extracting the signal charges accumulated in the n-type semiconductor region 19 of the first photodiode PD1 to the front side of the semiconductor substrate 17.

The second photodiode PD2 includes an n-type semiconductor region 21 formed on the front side of the semiconductor substrate 17, and a high-concentration p-type semiconductor region 22 serving as a hole accumulation layer formed on the interface of the semiconductor substrate 17 on the front side of the semiconductor substrate 17. In the first photodiode PD1 and the second photodiode PD2, the p-type semiconductor regions 20 and 22 formed on the interface of semiconductor substrate 17 can suppress the generation of dark current on the interface of the semiconductor substrate 17.

The second photodiode PD2 formed in a region that is most distant from the light receiving surface serves as a photoelectric conversion unit for photoelectrically converting light having a red wavelength. The first photodiode PD1 formed on the light receiving surface side serves as a photoelectric conversion unit for photoelectrically converting light having a blue wavelength.

In the pixel 2 illustrated in FIG. 3, a photoelectric conversion unit for photoelectrically converting light having a green wavelength is formed of the organic photoelectric conversion film 36a on the semiconductor substrate 17 on the back side of the semiconductor substrate 17. The organic photoelectric conversion film 36a is made of, for example, an organic photoelectric conversion material including a rhodamine-based pigment, a merocyanine-based pigment, a quinacridone-based pigment, or the like.

The top surface of the organic photoelectric conversion film 36a is covered by a passivation film (nitride film) 36b, and the organic photoelectric conversion film 36a and the passivation film 36b are sandwiched between an upper electrode 34a and a lower electrode 34b.

A planarization film 51 is formed on the upper side of the upper electrode 34a, and an on-chip lens 52 is provided on the top of the planarization film 51. An insulating film 35 for reduced differences at the edges of the lower electrode 34b is provided on the same plane as the lower electrode 34b in a region where the lower electrode 34b is not formed. Each of the upper electrode 34a and the lower electrode 34b is made of a light transmissive material, and is composed of a transparent conductive film such as an indium tin oxide (ITO) film or a zinc indium oxide film.

In this embodiment, the organic photoelectric conversion film 36a is composed of a material for photoelectrically converting green light. However, the organic photoelectric conversion film 36a may be composed of a material for photoelectrically converting light having a blue or red wavelength, and the first photodiode PD1 and the second photodiode PD2 may be configured so as to correspond to other wavelengths.

For example, if blue light is absorbed by the organic photoelectric conversion film 36a, the first photodiode PD1 formed on the light receiving surface side of the semiconductor substrate 17 can be set as a photoelectric conversion unit for photoelectrically converting green light, and the second photodiode PD2 can be set as a photoelectric conversion unit for photoelectrically converting red light.

Further, if red light is absorbed by the organic photoelectric conversion film 36a, the first photodiode PD1 formed on the light receiving surface side of the semiconductor substrate 17 can be set as a photoelectric conversion unit for photoelectrically converting blue light, and the second photodiode PD2 can be set as a photoelectric conversion unit for photoelectrically converting green light.

The organic photoelectric conversion film for photoelectrically converting blue light can be made of an organic photoelectric conversion material including a coumaric acid pigment, tris-8-hydroxyquinoline Al (Alq3), a merocyanine-based pigment, or the like. The organic photoelectric conversion film for photoelectrically converting red light can be made of an organic photoelectric conversion material including a phthalocyanine-based pigment.

As in this embodiment, preferably, blue light and red light are photoelectrically converted in the semiconductor substrate 17, and green light is photoelectrically converted in the organic photoelectric conversion film 36a. In this case, the spectral characteristics between the first and second photodiodes PD1 and PD2 can be improved.

The lower electrode 34b formed on the semiconductor substrate 17 side of the organic photoelectric conversion film 36a, described above, is connected to a conductive film 32 via a contact plug 32a extending through the insulating film 33. The conductive film 32 serves as a light shielding film and also as wiring. The conductive film 32 may be made of, for example, Al, Ti, W, or the like. The conductive film 32 is connected to a connection portion 23 of a vertical transfer path 60 via a contact plug 31 extending through an antireflective layer 30. The vertical transfer path 60 is formed from the back side to the front side of the semiconductor substrate 17.

The vertical transfer path 60 is constructed by a laminate structure of the connection portion 23, a potential barrier layer 24, a charge accumulation layer 25, and a p-type semiconductor region 26, which are formed vertically from the back side to the front side of the semiconductor substrate 17.

The connection portion 23 is formed of a high impurity concentration n-type impurity region in order to obtain ohmic contact with the contact plug 31. The potential barrier layer 24 is formed of a low-concentration p-type impurity region, and forms a potential barrier between the connection portion 23 and the charge accumulation layer 25. The charge accumulation layer 25 is a layer in which the signal charges transferred from the organic photoelectric conversion film 36a are accumulated, and is formed of an n-type impurity region having a lower concentration than the connection portion 23. The p-type semiconductor region 26 formed on the uppermost surface of the semiconductor substrate 17 is formed of a high-concentration p-type impurity region, and therefore the generation of dark current on the interface of the semiconductor substrate 17 can be reduced.

The vertical transfer path 60 will be described with reference to FIGS. 4A and 4B.

Figure 4A:
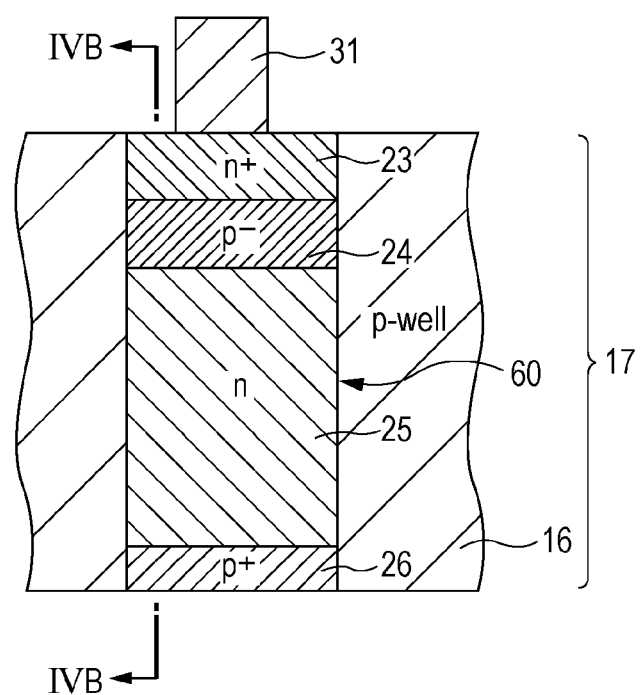
FIGS. 4A and 4B are diagrams illustrating a vertical transfer path.
Figure 4B:
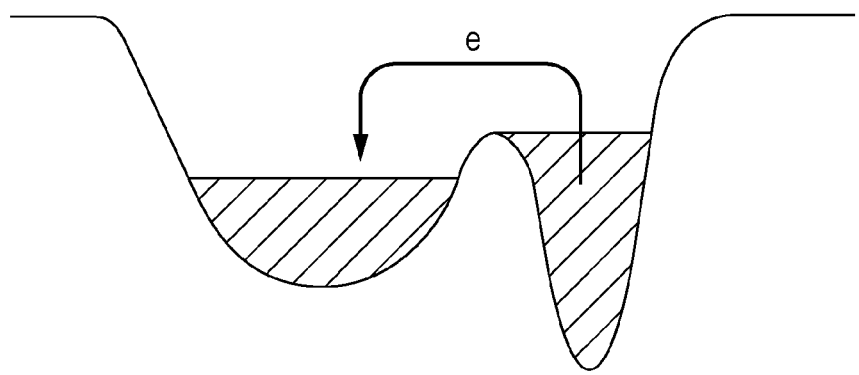

FIG. 4A is an enlarged view of the vertical transfer path 60, and FIG. 4B illustrates a cross-sectional configuration taken along line IVB-IVB in FIG. 4A.

The vertical transfer path 60 according to this embodiment has a potential gradient as illustrated in FIG. 4B. Thus, signal charges e transferred to the connection portion 23 from the organic photoelectric conversion film 36a through the contact plug 31, etc., flow over an overflow barrier (OFB) formed of the potential barrier layer 24, and are accumulated in the charge accumulation layer 25. The signal charges e accumulated in the charge accumulation layer 25 are read to the front side, or the circuit-forming surface, of the semiconductor substrate 17.

As illustrated in FIG. 2, the first, second, and third pixel transistors TrA, TrB, and TrC corresponding to the first photodiode PD1, the second photodiode PD2, and the organic photoelectric conversion film 36a, respectively, are formed on the front side, or the circuit-forming surface, of the semiconductor substrate 17.

Referring back to FIG. 3, the first transfer transistor Tr1 includes the floating diffusion portion FD1 formed on the front side of the semiconductor substrate 17 adjacent to the extending portion 19a of the first photodiode PD1, and a transfer gate electrode 37 formed on the semiconductor substrate 17 through a gate insulating film. The second transfer transistor Tr2 includes the floating diffusion portion FD2 formed on the front side of the semiconductor substrate 17 adjacent to the second photodiode PD2, and a transfer gate electrode 38 formed on the semiconductor substrate 17 through a gate insulating film. The third transfer transistor Tr3 includes the floating diffusion portion FD3 formed on the front side of the semiconductor substrate 17 adjacent to the vertical transfer path 60, and a transfer gate electrode 39 formed on the semiconductor substrate 17 through a gate insulating film.

The floating diffusion portions FD1, FD2, and FD3 are formed of n-type high-concentration impurity regions, and the transfer gate electrodes 37 to 39 are composed of, for example, polysilicon.

A multilayer wiring layer 27 having a plurality of (in this embodiment, three) wiring layers 28 which are stacked on top of one another via an interlayer insulating film 29 is formed on the front side of the semiconductor substrate 17. Further, a support substrate 61 formed during the manufacturing stage is formed on a surface of the multilayer wiring layer 27.

As described above, therefore, due to the vertical spectral separation in the pixels 2, the solid-state imaging device 1 according to this embodiment has no color filters.

1-4 Problems with Related Art

In the structure of each of the pixels 2 described with reference to FIGS. 3 and 4, for the purpose of the formation of ohmic contact with the contact plug 31, the connection portion 23 should be a high-concentration n-type impurity region. Specifically, the connection portion 23 should have a concentration as high as $1 \times 10^{19}/cm^3$ to $1 \times 10^{20}/cm^3$.

An existing method for forming the connection portion 23 will be described with reference to FIGS. 5A to 5C.

Figure 5A:
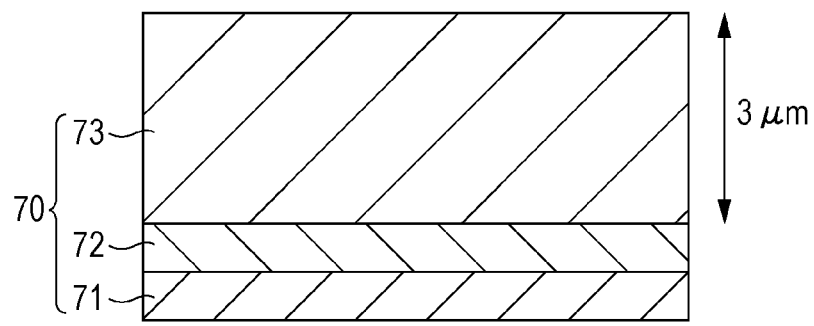
FIGS. 5A to 5C are diagrams illustrating an existing method for forming a connection portion.

First, a silicon-on-insulator (SOI) substrate 70 illustrated in FIG. 5A is prepared. The SOI substrate 70 is formed by stacking a buried oxide (BOX) layer 72 and a semiconductor layer 73 composed of silicon in sequence on top of one another on a support substrate 71 composed of silicon. The semiconductor layer 73 of the SOI substrate 70 corresponds to the semiconductor substrate 17 illustrated in FIG. 3. The semiconductor layer 73 is, for example, an n-type semiconductor layer, and has a thickness of, for example, 3 μm.

Figure 5B:
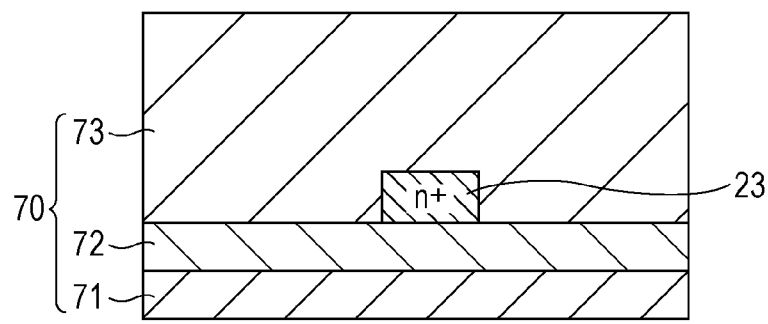

Then, as illustrated in FIG. 5B, n-type impurities are ion-implanted into a deep region near the interface of the BOX layer 72 of the semiconductor layer 73 of the SOI substrate 70 at a high concentration to form the connection portion 23.

Figure 5C:
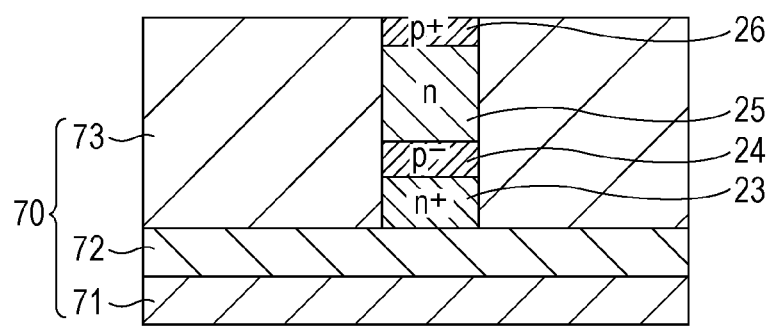

After that, as illustrated in FIG. 5C, the potential barrier layer 24, the charge accumulation layer 25, and the p-type semiconductor region 26 are formed in sequence by ion implantation. After the support substrate 71 and the BOX layer 72 are removed, the resulting structure is flipped upside down to obtain the vertical transfer path 60 illustrated in FIGS. 3 and 4A.

As described above, the existing manufacturing method involves ion implantation of n-type impurities at a high concentration into a deep region near the interface of the BOX layer 72 of the semiconductor layer 73. However, it has been difficult to form the connection portion 23 so that a sharp impurity concentration distribution is obtained in a deep region of the semiconductor layer 73.

1-5 First Manufacturing Method

In this embodiment, the connection portion 23, which is a high-concentration impurity region, is formed using, for example, the following first to fourth manufacturing methods.

Figure 6A:
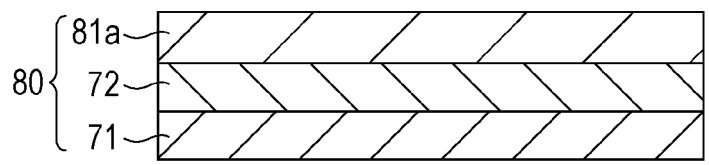
FIGS. 6A and 6B are diagrams illustrating an overview of first to fourth manufacturing methods of the connection portion.

In the following first to fourth manufacturing methods, first, as illustrated in FIG. 6A, a SOI substrate 80 having a semiconductor layer 81a that is thinner than the semiconductor layer 73 having a thickness of 3 μm illustrated in FIG. 5A is prepared. The SOI substrate 80 is formed by stacking a BOX layer 72 and the semiconductor layer 81a in sequence on top of each other on a support substrate 71. The thickness of the semiconductor layer 81a can be determined, as desired, within a range of 10 nm to 500 nm.

Figure 6B:
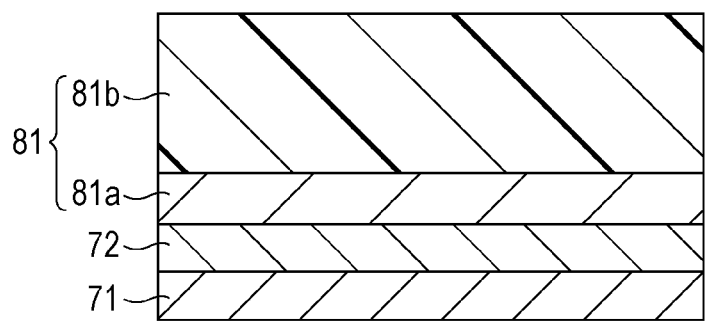

Then, after a predetermined process, as illustrated in FIG. 6B, an epitaxial growth is performed to additionally form a semiconductor layer 81b. A semiconductor layer 81 having the semiconductor layers 81a and 81b illustrated in FIG. 6B corresponds to the semiconductor layer 73 illustrated in FIG. 5. In this embodiment, by way of example, the conductivity type of the semiconductor layers 81a and 81b when first formed is a second conductivity type (n type).

Figure 7:
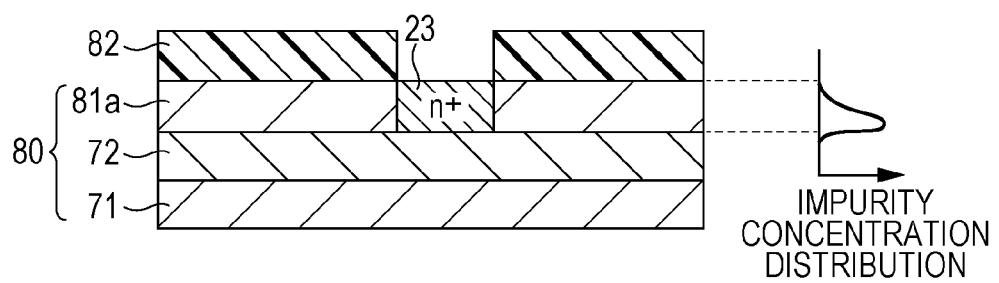
FIG. 7 is a diagram illustrating the first manufacturing method of the connection portion.

The first manufacturing method of the connection portion 23 will be described with reference to FIG. 7.

In the first manufacturing method, a resist 82 is formed so that an opening region, which will become the connection portion 23, is formed in the thin-film semiconductor layer 81a. Then, the irradiation energy is increased with a high dose, an ion implantation depth Rp (projection range of implanted ions) is set near the interface of the BOX layer 72, and n-type impurities are ion-implanted at a high concentration. Thus, the connection portion 23 is formed. The ion implantation depth Rp corresponds to a position at which a peak of an impurity concentration distribution (or profile) is obtained. In the first manufacturing method, the thin-film semiconductor layer 81a has a thickness of, for example, 200 nm to 300 nm, and the ion implantation depth Rp can have a range of up to, for example, 100 nm from the interface of the BOX layer 72.

In the first manufacturing method, however, the high-energy ions may damage the crystallinity of the connection portion 23, and it is difficult to recover the crystallinity. In addition, due to the irradiation with the high-energy ions, the resist 82 is cured, and therefore it is difficult to remove the resist 82.

1-6 Second Manufacturing Method

Figure 8A:
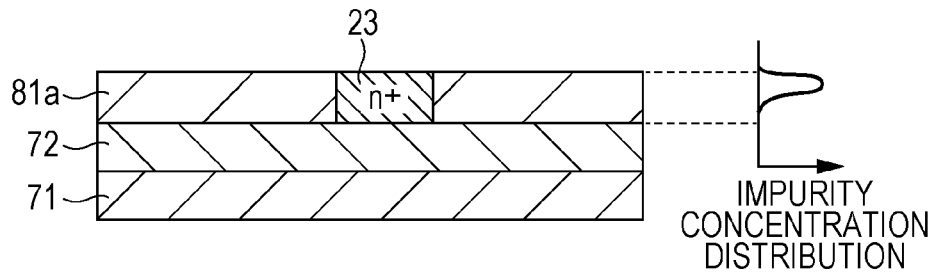
FIGS. 8A to 8C are diagrams illustrating the second manufacturing method of the connection portion.

Therefore, as in a second manufacturing method illustrated in FIG. 8A, there is also a method for forming the connection portion 23 by increasing the dose, by achieving a shallow ion implantation depth Rp, that is, setting the ion implantation depth Rp on the front side of the thin-film semiconductor layer 81a, and by ion-implanting n-type impurities at a high concentration.

Figure 8B:
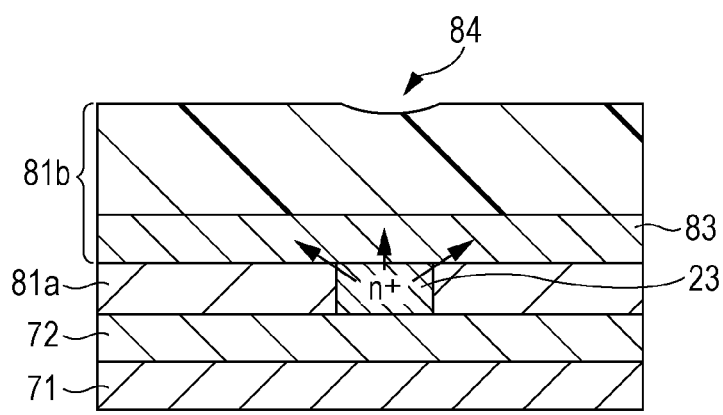

In this case, however, due to the high-temperature epitaxial growth for forming the semiconductor layer 81b, the impurity concentration on a surface of the semiconductor layer 81a is increased. For this reason, as illustrated in FIG. 8B, the semiconductor layer 81b, which is an active layer formed by epitaxial growth, includes an autodoped region 83 in which the resistivity of the active layer has been reduced by autodoping. As a result, the design of the potentials of photodiodes becomes difficult. In addition, a local depression 84 is formed in the semiconductor layer 81b, which is an active layer formed by epitaxial growth, at a position corresponding to an upper portion of the connection portion 23. This induces SiN residue during shallow trench isolation (STI) formation, and a problem may occur during contact formation.

Figure 8C:
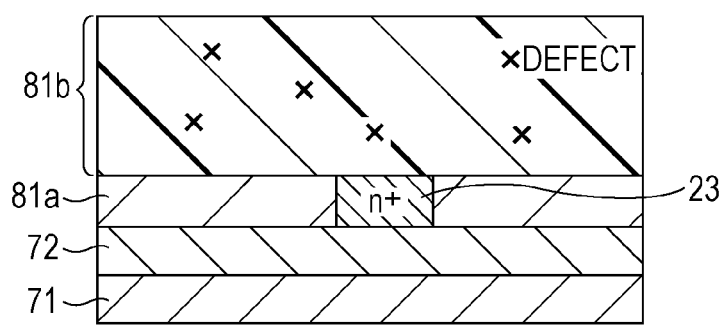

In contrast, if the semiconductor layer 81b is formed by epitaxial growth with low temperature enough to suppress autodoping, as illustrated in FIG. 8C, crystal defects are likely to occur in the semiconductor layer 81b.

Furthermore, if the dose is reduced enough to suppress autodoping, contact resistance increases.

Therefore, the first and second manufacturing methods enable the connection portion 23 to be formed so that the impurity concentration distribution becomes sharper than that obtained in a manufacturing method of the related art can be obtained. However, these methods are not necessarily optimum.

1-7 Third Manufacturing Method

Next, a third manufacturing method of the connection portion 23 will be described with reference to FIGS. 9A to 9C and FIGS. 10A to 10D.

Figure 9A:
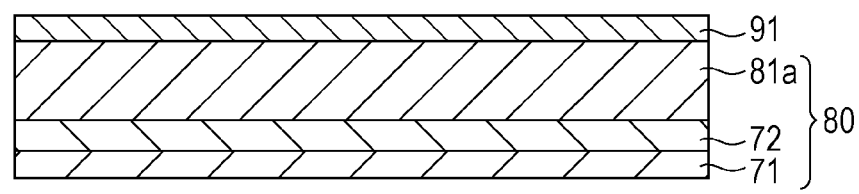
FIGS. 9A to 9C are diagrams illustrating the third manufacturing method of the connection portion.

First, as illustrated in FIG. 9A, a hard mask oxide film 91 is deposited on the top of a SOI substrate 80 including a semiconductor layer 81a, a BOX layer 72, and a support substrate 71. The oxide film 91 may be, for example, a thermal oxide film or a low-pressure tetraethyl orthosilicate (LP-TEOS) film. In the third manufacturing method, the thin-film semiconductor layer 81a may have a thickness of, for example, 200 nm to 300 nm.

Figure 9B:
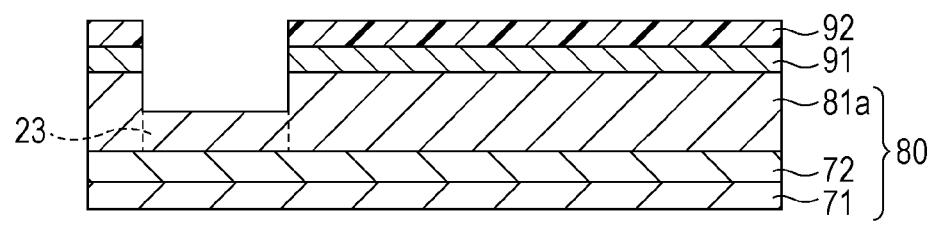

Then, as illustrated in FIG. 9B, after a resist 92 is applied to the oxide film 91, an opening is formed, using photolithography and dry etching, in a region of the semiconductor layer 81a, which will become the connection portion 23.

The trench (or opening) is etched using, for example, a single-wafer dry etching apparatus by performing treatment under conditions of a pressure of 50 mTorr to 150 mTorr, a radio frequency (RF) power of 500 W to 900 W, and HBr, $SF_6$, and $O_2$ as etch gases at 100 sccm to 300 sccm, 10 sccm to 30 sccm, and 0 sccm to 10 sccm, respectively. After dry etching, a post-treatment process for removing silicon damage caused by dry etching, that is, removing silicon crystal defects or impurities, is carried out. In the post-treatment process, preferably, for example, chemical dry etching (CDE) that is damage-less etching, a hot SC1 sacrificial oxidation treatment with ammonia and hydrogen peroxide solution, and a diluted hydrofluoric acid (DHF) treatment are additionally carried out.

Figure 9C:
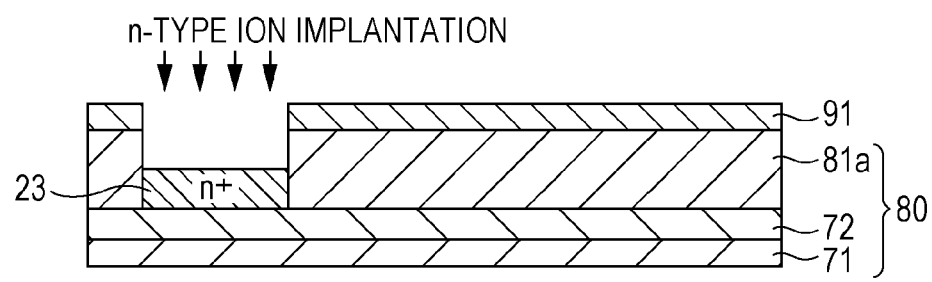

After the resist 92 is removed from the oxide film 91, as illustrated in FIG. 9C, n-type impurities are ion-implanted at a high concentration into the opening region in the semiconductor layer 81a, which will become the connection portion 23, and the connection portion 23 is formed. In order to obtain ohmic contact with the contact plug 31 for extracting the signal charges from the organic photoelectric conversion film 36a, the connection portion 23 has an impurity concentration of approximately $1 \times 10^{19}/cm^3$ to $1 \times 10^{20}/cm^3$. The n-type impurities to be implanted may be, for example, phosphorus (P) or arsenic (As).

Figure 10A:
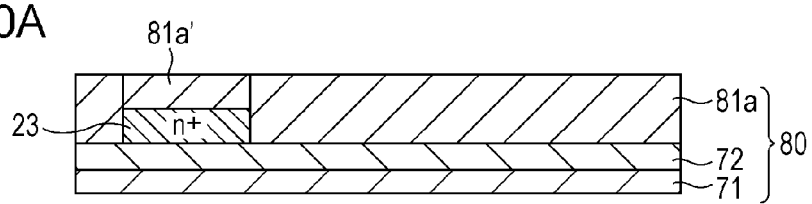
FIGS. 10A to 10D are diagrams illustrating the third manufacturing method of the connection portion.

Then, as illustrated in FIG. 10A, after the oxide film 91 is removed, a semiconductor layer 81a' (silicon) is formed by selective low-temperature epitaxial growth in which only an etched region on the connection portion 23 formed by ion implantation is selected. That is, the etched region is backfilled to the original thickness of the semiconductor layer 81a by selective low-temperature epitaxial growth. Here, low-temperature epitaxial growth can be carried out under conditions of, for example, a temperature of 600° C. to 950° C., a pressure of 10 Torr to 760 Torr, a dichlorosilane (DCS) flow rate of 10 sccm to 100 sccm, a hydrogen chloride (HCl) flow rate of 10 sccm to 300 sccm, and a hydrogen ($H_2$) flow rate of 10 slm to 50 slm. Since the semiconductor layer 81a' is formed by low-temperature epitaxial growth, the impurities of the connection portion 23 are not doped. In the above conditions, the "low-temperature" is, as described above, 950° C. or less, preferably, 900° C. or less. In place of dichlorosilane (DCS) described above, $SiH_4$, $SiH_3Cl$, $SiH_2Cl_2$, $SiHCl_3$, $SiCl_4$, or the like may be used. It takes approximately 20 minutes to form the semiconductor layer 81a' having a thickness of 200 nm by low-temperature epitaxial growth.

Figure 10B:
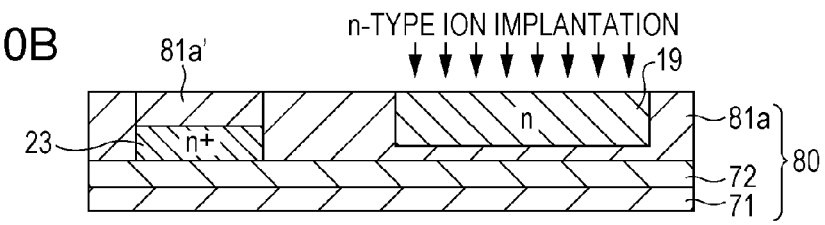

Next, as illustrated in FIG. 10B, n-type impurities such as phosphorus or arsenic are ion-implanted into a region at a horizontal position different from the horizontal position of the connection portion 23 in the semiconductor layer 81a, and an n-type semiconductor region 19 is formed. The n-type semiconductor region 19 forms the first photodiode PD1 described above.

Figure 10C:
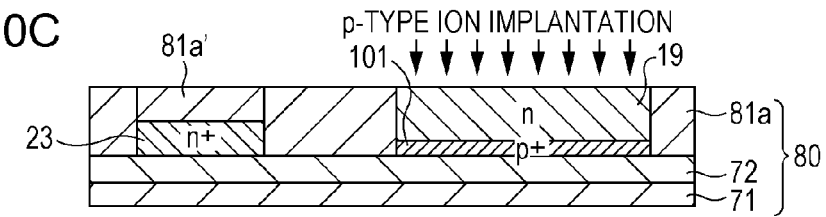

As illustrated in FIG. 10C, p-type impurities may be ion-implanted at a high concentration into the region of the semiconductor layer 81a between the n-type semiconductor region 19, which will become the first photodiode PD1, and the BOX layer 72 to form a pinning layer 101. If the pinning layer 101 is not provided in the semiconductor layer 81a, a pinning film may be formed using a film having a negative fixed charge as an antireflective layer 30 to be deposited after the support substrate 71 and the BOX layer 72 have been removed. The pinning film having a negative fixed charge may be, for example, a hafnium oxide ($HfO_2$) film, an aluminum oxide ($Al_2O_3$) film, or the like. The pinning layer 101 or the pinning film enhances hole accumulation on the interface of the semiconductor substrate 17 on the back side of the semiconductor substrate 17, and can suppress the generation of dark current.

Figure 10D:
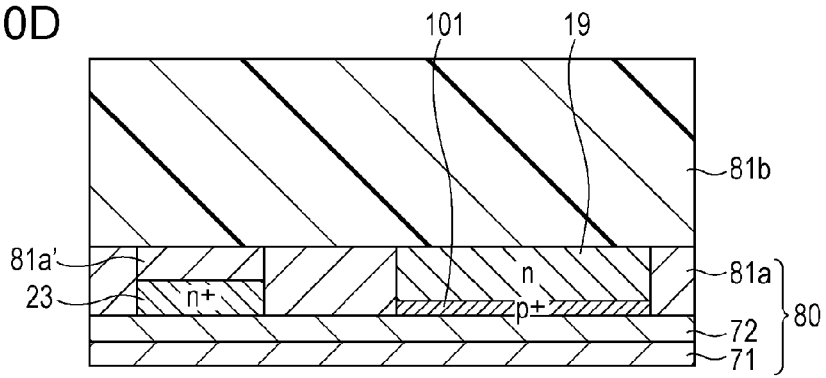

Finally, as illustrated in FIG. 10D, an n-type semiconductor layer 81b is formed by high-temperature epitaxial growth. The semiconductor layer 81b is epitaxially grown until the thickness of the composite of the n-type semiconductor layer 81b formed by high-temperature epitaxial growth and the semiconductor layer 81a of the SOI substrate 80 becomes equal to a thickness (3 μm), which is similar to that of the semiconductor layer 73 in the existing method. Even if the n-type semiconductor layer 81b is formed by high-temperature epitaxial growth, the connection portion 23 is covered by the semiconductor layer 81a' formed by low-temperature epitaxial growth. Therefore, the impurities of the connection portion 23 that is a high-concentration impurity region are not doped into the n-type semiconductor layer 81b.

In the third manufacturing method described above, the semiconductor layer 81a having a thickness of, for example, approximately 200 nm to 300 nm is made thinner by dry etching, and ion implantation is performed to form a high-concentration impurity region, which will become the connection portion 23. After selective low-temperature epitaxial growth is performed to additionally form the semiconductor layer 81a' (silicon) on the upper portion of the formed connection portion 23 that is a high-concentration impurity region, high-temperature epitaxial growth is further performed to additionally form the semiconductor layer 81b.

1-8 Fourth Manufacturing Method

Next, a fourth manufacturing method of the connection portion 23 will be described with reference to FIGS. 11A to 11F.

Figure 11A:
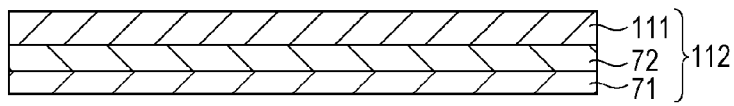
FIGS. 11A to 11F are diagrams illustrating the fourth manufacturing method of the connection portion.

In the fourth manufacturing method, as illustrated in FIG. 11A, a SOI substrate 112 is used in which an n-type semiconductor layer 111 formed on the top of a BOX layer 72 is thinner than the semiconductor layer 81a of the SOI substrate 80 described above. The n-type semiconductor layer 111 has a thickness of, for example, approximately 100 nm.

Figure 11B:
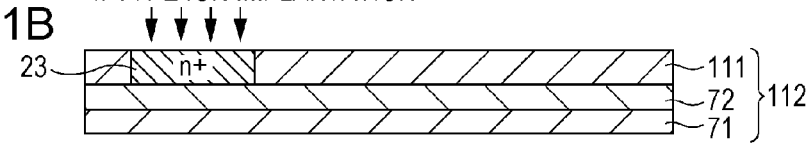

Then, as illustrated in FIG. 11B, p-type impurities are ion-implanted at a high concentration into a predetermined region of the semiconductor layer 111 to form a connection portion 23. In order to obtain ohmic contact with the contact plug 31 for extracting the signal charges from the organic photoelectric conversion film 36a, the connection portion 23 has an impurity concentration of approximately $1 \times 10^{19}/cm^3$ to $1 \times 10^{20}/cm^3$. The p-type impurities to be implanted may be, for example, phosphorus (P) or arsenic (As).

Figure 11C:
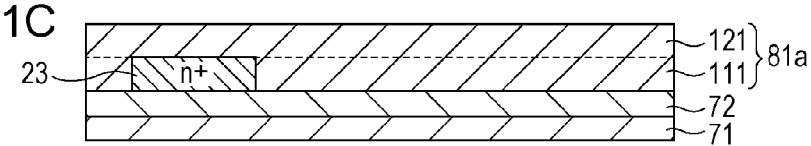

Then, as illustrated in FIG. 11C, an n-type semiconductor layer 121 is formed by high-temperature epitaxial growth until a thickness enough to form an n-type semiconductor region 19, which will become the first photodiode PD1, can be obtained, namely, until a thickness of 200 nm to 300 nm, described with reference to FIG. 6A, can be obtained. In other words, a semiconductor layer including the semiconductor layer 121 additionally formed by high-temperature epitaxial growth and the semiconductor layer 111 forms the semiconductor layer 81a illustrated in FIG. 6A.

Figure 11D:
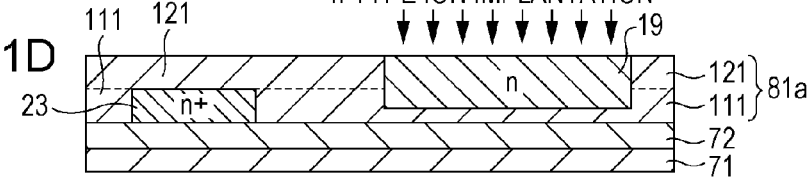
Figure 11E:
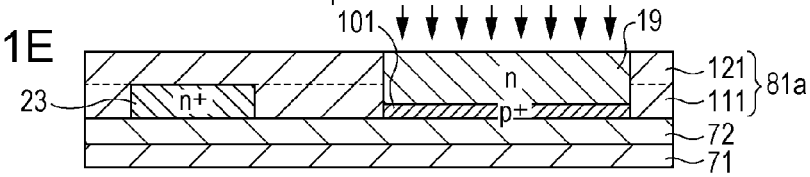
Figure 11F:
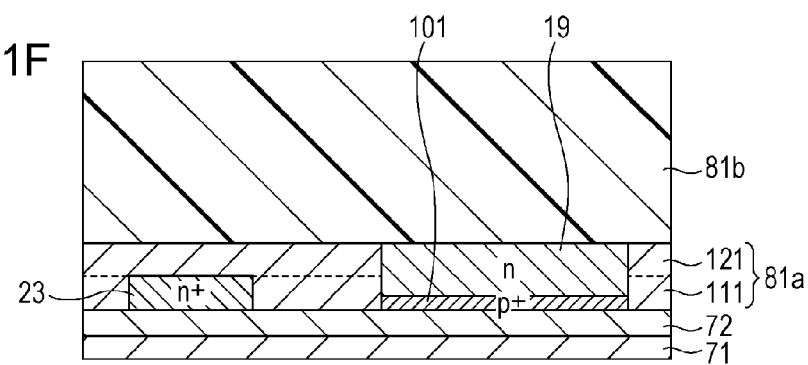

The subsequent process is similar to that in the third manufacturing method described above. That is, as illustrated in FIG. 11D, n-type impurities are ion-implanted at a high concentration, and the n-type semiconductor region 19 for forming the first photodiode PD1 is formed. Then, as illustrated in FIG. 11E, a pinning layer 101 is formed by implantation of p-type ions, as necessary, and, as illustrated in FIG. 11F, an n-type semiconductor layer 81b is formed by high-temperature epitaxial growth.

In the fourth manufacturing method described above, a high-concentration impurity region serving as the connection portion 23 is formed, by ion implantation, in the semiconductor layer 111 having a thickness of, for example, approximately 100 nm. After high-temperature epitaxial growth is performed to additionally form the semiconductor layer 121 (silicon) on the entirety of the semiconductor layer 111, high-temperature epitaxial growth is performed to form the semiconductor layer 81b.

In either of the third and fourth manufacturing methods, the connection portion 23 that is a high-concentration impurity region is formed, and the interface of the BOX layer 72 is covered by the connection portion 23. The formed connection portion 23 is covered by the semiconductor layer 81a' or 121 additionally formed by epitaxial growth. Further, in the state where the connection portion 23 is covered by the semiconductor layer 81a' or 121, the semiconductor layer 81b is further formed by high-temperature epitaxial growth. Therefore, autodoping can be suppressed.

Furthermore, ions can be implanted into the thin semiconductor layer 81a to form the connection portion 23 that is brought into ohmic contact with the contact plug 31 and the n-type semiconductor region 19, which will become the first photodiode PD1. Thus, a high-concentration impurity region where the impurity concentration distribution (or profile) exhibits a peak Rp near the interface of the BOX layer 72 can be formed. That is, the n-type semiconductor region 19 and the connection portion 23 in which the impurity concentration distribution (or profile) exhibits a peak Rp can be formed in the "deep" region in the semiconductor layer 73 having a thickness of approximately 3 μm in the existing method. Therefore, both suppression of autodoping and reduction in contact resistance can be achieved. In addition, crystallinity of elements other than the connection portion 23 can also be improved, and white spot and dark current characteristics can be improved.

The term "near the interface of the BOX layer 72" where the impurity concentration distribution (or profile) exhibits a peak Rp specifically refers to the side closer to the interface than the potential barrier layer 24, and is in a range of up to 100 nm from the interface of the BOX layer 72.

1-9 Manufacturing Process of Back Side of Semiconductor Substrate

A manufacturing process of the back side, or the light incident surface, of the semiconductor substrate 17 will be briefly described with reference to FIGS. 12 to 15.

Figure 12:
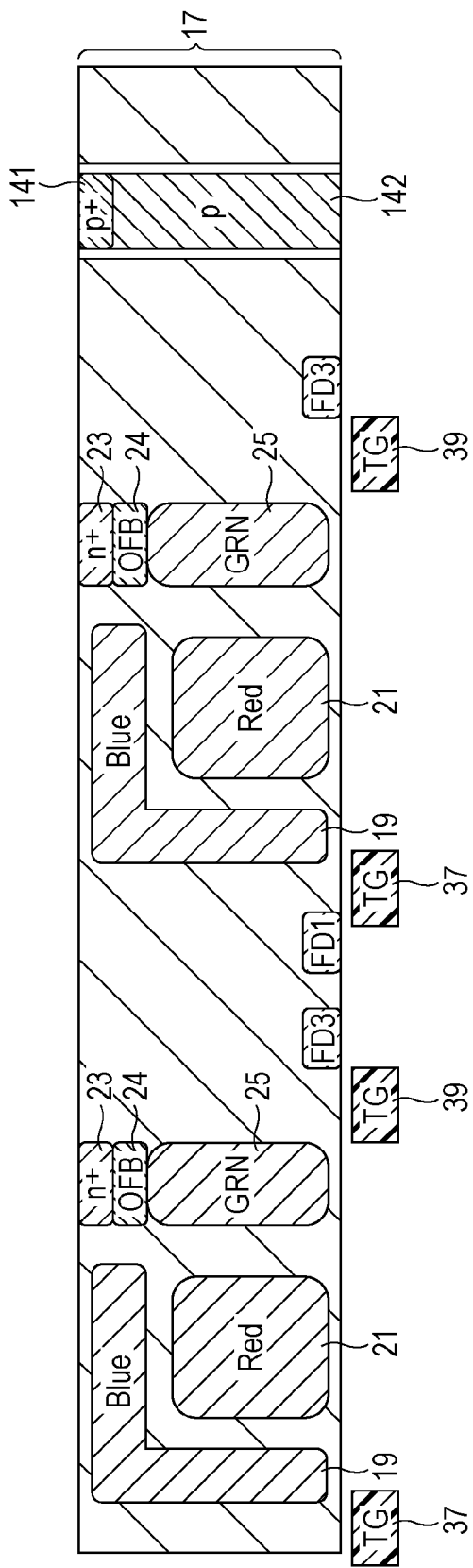
FIG. 12 is a diagram briefly illustrating a manufacturing process of a back side of a semiconductor substrate.

FIG. 12 illustrates a state obtained by forming the n-type semiconductor region 21, which will become the second photodiode PD2, and the potential barrier layer 24, the charge accumulation layer 25, etc., which form the vertical transfer path 60, on the semiconductor substrate 17 having the semiconductor layers 81a and 81b, flipping the semiconductor substrate 17, and removing the support substrate 71 and the BOX layer 72.

In FIGS. 12 to 15, portions corresponding to those in FIG. 3 are assigned the same numerals, and the description thereof is thus omitted. FIGS. 12 to 15 illustrate a schematic configuration, and some of the portions illustrated in FIG. 3 are not illustrated in FIGS. 12 to 15.

A connection portion 141 and a contact plug 142 illustrated in FIG. 12 are not illustrated in FIG. 3, and a brief description thereof will be thus given below. The connection portion 141 is finally connected to the upper electrode 34a (FIG. 3). Since holes are extracted at the upper electrode 34a, the connection portion 141 is formed of a high-concentration p-type impurity region. The contact plug 142 extends through the semiconductor substrate 17, and is connected to a circuit on the front side for supplying a predetermined potential to the upper electrode 34a. The contact plug 142 can be formed of a p-type impurity region.

Figure 13:
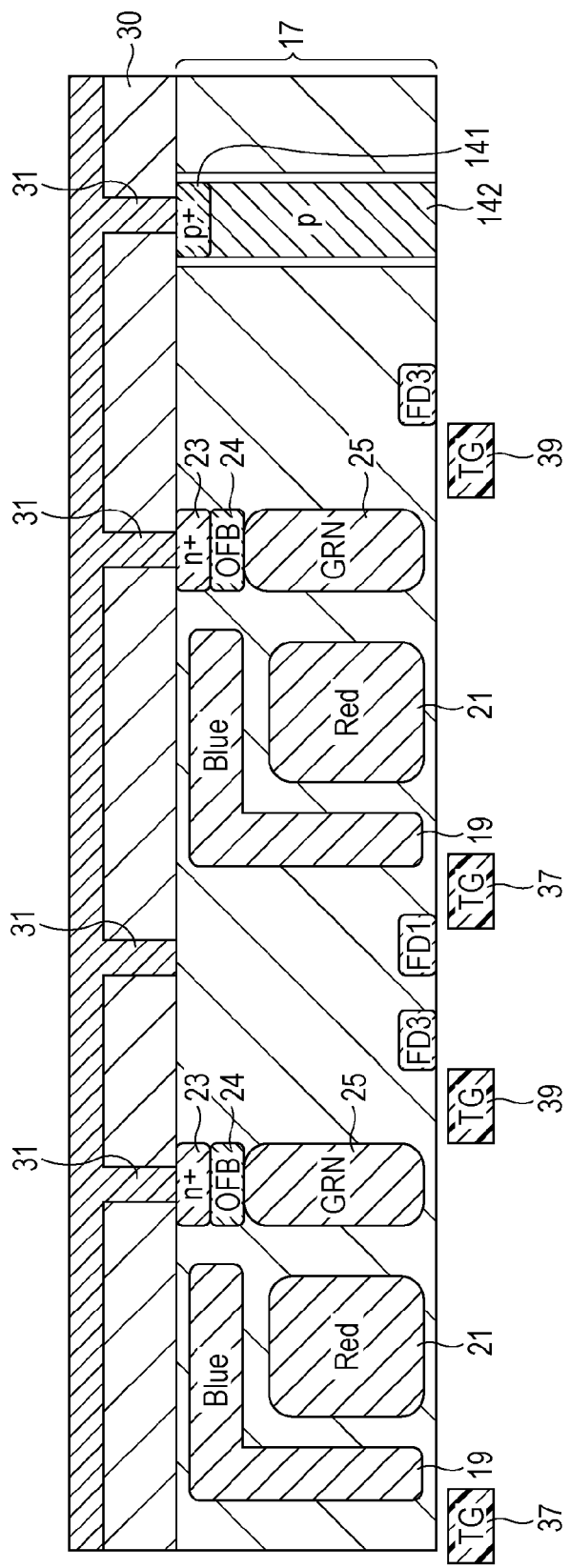
FIG. 13 is a diagram briefly illustrating the manufacturing process of the back side of the semiconductor substrate.

After the state illustrated in FIG. 12, as illustrated in FIG. 13, the antireflective layer 30 is formed on the back side of the semiconductor substrate 17, and contact holes are formed in upper portions of the connection portions 23 and 141. Further, a conductive film is embedded in the formed contact holes to form the contact plug 31, and, in addition, the same conductive film is stacked on the top surface of the antireflective layer 30.

Figure 14:
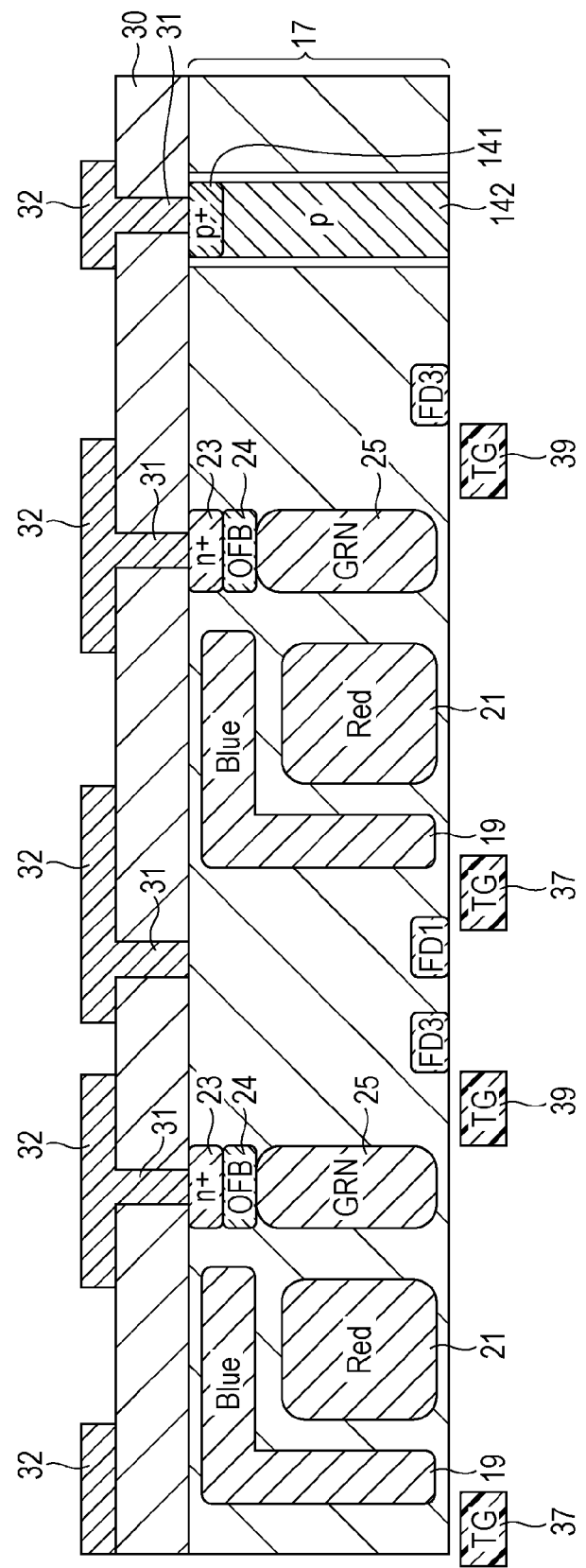
FIG. 14 is a diagram briefly illustrating the manufacturing process of the back side of the semiconductor substrate.

As illustrated in FIG. 14, the conductive film stacked on the top surface of the antireflective layer 30 is processed so that only a region to be shielded from light remains, and thereby light shielding films 32 are formed. The light shielding films 32 also serve as wiring. Since the material of the contact plug 31 is also used to make the light shielding films 32, the contact plug 31 and the light shielding films 32 can be formed without increasing the number of steps. The conductive film forming the contact plug 31 and the light shielding films 32 is preferably formed of, as a barrier metal film, a multilayer film of titanium (Ti) and titanium nitride (TiN), and the metal material to be embedded in the contact holes is preferably tungsten (W).

Figure 15:
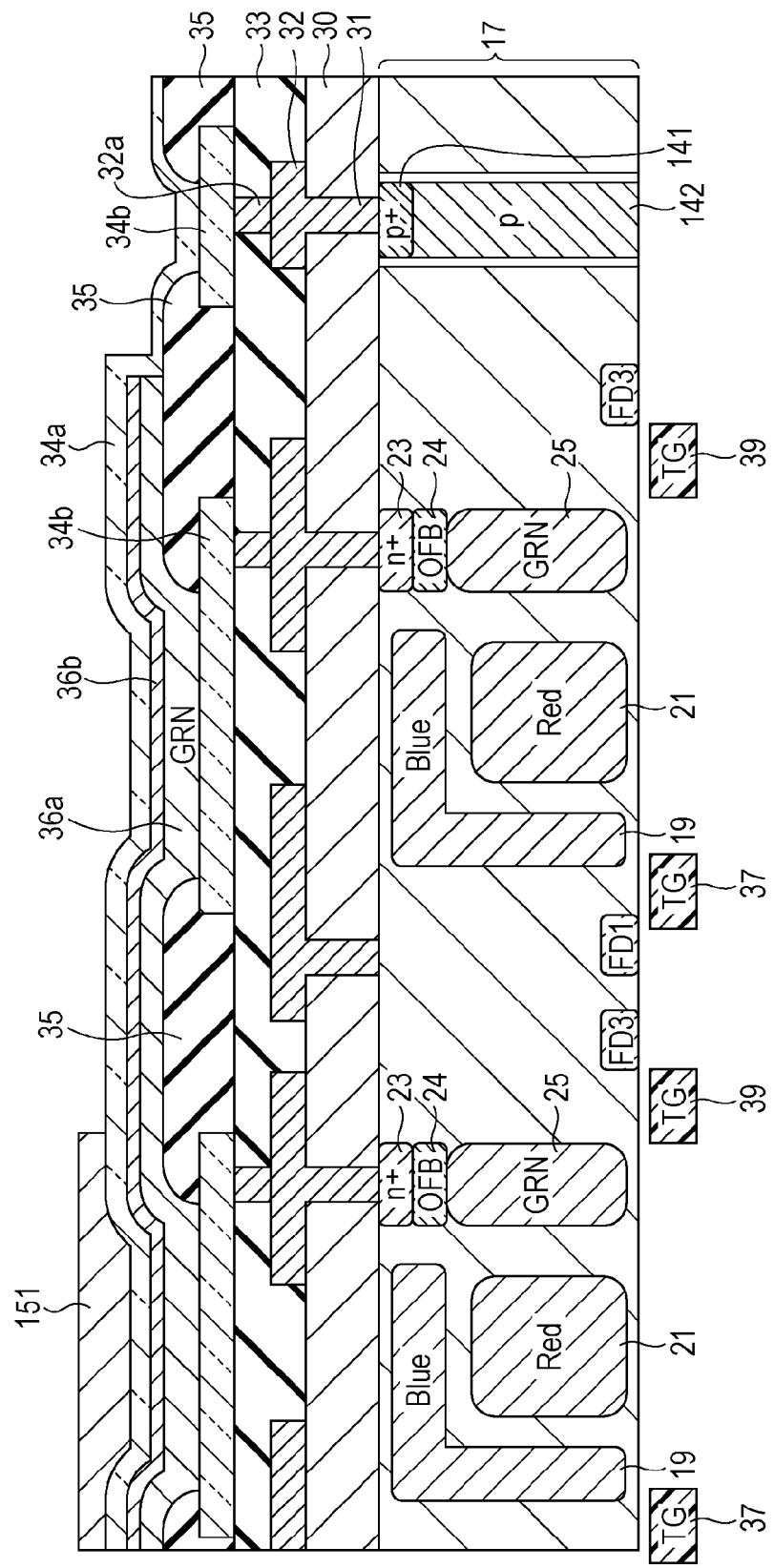
FIG. 15 is a diagram briefly illustrating the manufacturing process of the back side of the semiconductor substrate.

Next, as illustrated in FIG. 15, the insulating film 33 is formed on the light shielding films 32, and is planarized using chemical mechanical polishing (CMP).

In the planarized insulating film 33, openings are formed in the light shielding films 32 and the upper portions of the contact plugs 31, and the contact plugs 32a are formed in the openings. After that, the lower electrode 34b and the insulating film 35 for reduced differences at the edges of the lower electrode 34b are formed. The insulating film 35 is formed by depositing a film over an entire surface and then etching the film so as to be tapered to expose a surface of the lower electrode 34b.

Then, the organic photoelectric conversion film 36a for photoelectrically converting green light, the passivation film 36b, and the upper electrode 34a are stacked on top of one another. While the organic photoelectric conversion film 36a and the passivation film 36b are formed on the entirety of the upper portions of the lower electrode 34b and the insulating film 35, the upper electrode 34a is formed only in a region where the organic photoelectric conversion film 36a and the passivation film 36b are formed in FIG. 15. Then, the organic photoelectric conversion film 36a and the passivation film 36b are etched so as to be left only in the region illustrated in FIG. 15, using as a hard mask the upper electrode 34a formed only in a partial region. After that, a remaining region of the upper electrode 34a, that is, the upper electrode 34a formed on the top surface of the lower electrode 34b, which is connected to the connection portion 141 at the right end in FIG. 15, and the insulating film 35 surrounding the lower electrode 34b, is formed. For each pixel in the black reference pixel region, a light shielding film 151 is also formed.

1-10 Driving Method

Next, a description will be made of a method for driving the solid-state imaging device 1. The driving method will be described with reference to FIGS. 2 and 3.

A fixed negative voltage VL is applied to the upper electrode 34a formed on the light receiving surface side of the organic photoelectric conversion film 36a, and a voltage VH higher than the voltage VL is applied to the lower electrode 34b connected to the contact plug 31 during charge accumulation. The voltage VH is determined by the potential of the overflow barrier.

During charge accumulation, if light enters one of the pixels 2, light having a green wavelength is photoelectrically converted by the organic photoelectric conversion film 36a having the characteristic of absorbing light having a green wavelength, and electron-hole pairs are formed in the organic photoelectric conversion film 36a. Of the electron-hole pairs generated through photoelectric conversion, electrons which become signal charges are attracted to the lower electrode 34b to which the high voltage VH is applied, and are transferred to the connection portion 23 through the contact plug 31. The signal charges exceeding the saturation amount of the connection portion 23 are overflowed into the charge accumulation layer 25 through the potential barrier layer 24, and are accumulated in the charge accumulation layer 25. The holes are attracted to the upper electrode 34a to which the negative voltage VL is applied, and are ejected through certain wiring (not illustrated). In this embodiment, since the high voltage VH is applied to the lower electrode 34b, the polarity of the high voltage VH corresponds to the polarity of a bias voltage which induces a dark current on the interface of the semiconductor substrate 17 on the back side of the semiconductor substrate 17. However, the antireflective layer 30 is formed using hafnium oxide or the like, thus allowing holes to be excited on the back surface of the semiconductor substrate 17. Thus, the generation of dark current on the interface of the semiconductor substrate 17, which is caused by the voltage VH applied to the lower electrode 34b, can be suppressed.

Further, light having a blue wavelength is absorbed by the first photodiode PD1 formed in the semiconductor substrate 17 near the light receiving surface, and is photoelectrically converted. Therefore, signal charges corresponding to the blue light are accumulated in the n-type semiconductor region 19 of the first photodiode PD1. Light having a red wavelength is absorbed by the second photodiode PD2 formed in the semiconductor substrate 17 in a deep portion in the depth direction from the light receiving surface, and is photoelectrically converted. Therefore, signal charges corresponding to the red light are accumulated in the n-type semiconductor region 21 of the second photodiode PD2.

After charge accumulation, desired transfer pulses are applied to the transfer gate electrodes 37, 38, and 39 of the first, second, and third transfer transistors Tr1, Tr2, and Tr3, thereby starting charge readout. In the first transfer transistor Tr1, the signal charges corresponding to the blue light, which have been accumulated in the n-type semiconductor region 19 of the first photodiode PD1, are read to the floating diffusion portion FD1 through the extending portion 19a. In the second transfer transistor Tr2, the signal charges corresponding to the red light, which have been accumulated in the n-type semiconductor region 21 of the second photodiode PD2, are read to the floating diffusion portion FD2. In the third transfer transistor Tr3, the signal charges corresponding to the green light, which have been accumulated in the charge accumulation layer 25 of the vertical transfer path 60, are read to the floating diffusion portion FD3.

Changes in potential caused by reading the respective signal charges to the floating diffusion portions FD1, FD2, and FD3 are amplified by the amplification transistors Tr5, Tr8, and Tr11 to produce pixel signals, and the pixel signals are read to vertical signal wiring (not illustrated). The timings of reading the pixel signals to vertical signal wiring are determined by the selection transistors Tr6, Tr9, and Tr12.

After the signal charges are read and transferred, the signal charges read by the floating diffusion portions FD1, FD2, and FD3 are reset by the reset transistors Tr4, Tr7, and Tr10, respectively.

In this embodiment, signal charges generated in the organic photoelectric conversion film 36a can be vertically overflowed into and transferred into the charge accumulation layer 25 from the connection portion 23 in the vertical transfer path 60 formed in the semiconductor substrate 17, and can be accumulated in the charge accumulation layer 25. The formation of the vertical transfer path 60 having such a vertical overflow structure can be precisely controlled by, as described above, ion implantation energy, and can be more easily manufactured than a transfer path having a lateral overflow structure. Therefore, process controllability can be improved. In addition, since the vertical transfer path 60 is vertically formed from the back side to the front side of the semiconductor substrate 17, it is possible to read signal charges generated in the organic photoelectric conversion film 36a from the back side to the front side of the semiconductor substrate 17 without increasing the pixel size.

Furthermore, the charge accumulation layer 25 can be formed in close proximity to the transfer gate electrode 39, and is therefore advantageous to transfer signal charges from the charge accumulation layer 25 to the floating diffusion portion FD3. In addition, because of a back-illuminated solid-state imaging device, the multilayer wiring layer 27 is not formed on the back side, or the light receiving surface, of the semiconductor substrate 17, and the organic photoelectric conversion film 36a and the first and second photodiodes PD1 and PD2 formed on the semiconductor substrate 17 can be formed within a short distance. Therefore, the influence of the F-value on changes in sensitivity for each color, which are caused when the distances between the organic photoelectric conversion film 36a and the first and second photodiodes PD1 and PD2 are large, can be reduced.

While this embodiment provides the pixels 2 having the configuration illustrated in FIG. 2, each pixel transistor may be shared by a plurality of pixels, by way of example.

2. Second Embodiment

Example of Forming Photoelectric Conversion Units for Three Colors in Semiconductor Layer In the first embodiment described above, a back-illuminated image sensor is employed having a structure in which a photoelectric conversion layer (organic photoelectric conversion film 36a) for one color is formed on the semiconductor substrate 17 and photoelectric conversion layers (first and second photodiodes PD1 and PD2) for two colors are formed in the semiconductor substrate 17.

Figure 16:
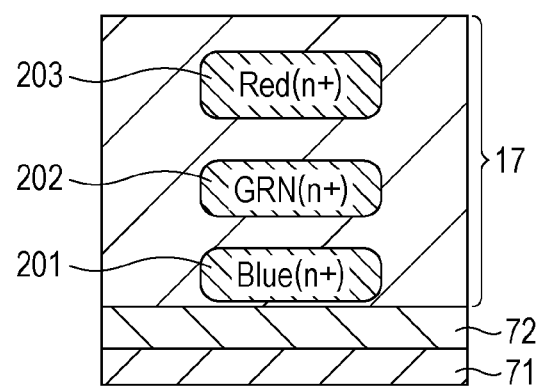
FIG. 16 is a diagram illustrating an example in which photoelectric conversion units for three colors are formed in a semiconductor layer.

As in the first to fourth manufacturing methods described above, in a method of performing epitaxial growth to increase the thickness of a semiconductor layer, as illustrated in FIG. 16, photoelectric conversion layers 201 to 203 for three colors (three layers) may be formed in the semiconductor substrate 17.

FIGS. 17A to 17C illustrate a first manufacturing method for forming three photoelectric conversion layers in the semiconductor substrate 17.

A process up to the formation of a photoelectric conversion layer 201 for blue, that is, a process up to the formation of the photoelectric conversion layer 201 for blue as an n-type impurity region in the semiconductor layer 81a of the SOI substrate 80, is similar to that in the third and fourth manufacturing methods described above, and the description thereof is thus omitted.

Then, as illustrated in FIG. 17A, p-type impurities such as boron (B) are ion-implanted into the semiconductor layer 81a in which the photoelectric conversion layer 201 for blue has been formed as an n-type high-concentration impurity region, and a p-type high-concentration impurity region 211 is formed. The p-type high-concentration impurity region 211 is used to electrically isolate the photoelectric conversion layer 201 for blue from a photoelectric conversion layer 202 for green which is to be formed on the top of the p-type high-concentration impurity region 211 to prevent color mixture.

Then, as illustrated in FIG. 17B, epitaxial growth is performed to additionally form an n-type semiconductor layer 212, and p-type impurities are ion-implanted into the n-type semiconductor layer 212. Thus, the semiconductor layer 212 is formed as a low-concentration p-type impurity region.

Then, as illustrated in FIG. 17C, n-type impurities are ion-implanted at a high concentration to form the photoelectric conversion layer 202 for green.

Then, as illustrated in FIG. 17D, as in FIG. 17A, a p-type high-concentration impurity region 213 for electrically isolating the photoelectric conversion layer 202 for green from a photoelectric conversion layer 203 for red which is to be formed on the top of the p-type high-concentration impurity region 213 is formed by ion implantation.

Further, as illustrated in FIG. 17E, epitaxial growth is further performed to additionally form an n-type semiconductor layer 214, and p-type impurities are ion-implanted into the n-type semiconductor layer 214. Thus, the semiconductor layer 214 is formed as a low-concentration p-type impurity region.

Then, as illustrated in FIG. 17F, n-type impurities are ion-implanted at a high concentration to form the photoelectric conversion layer 203 for red.

Figure 18A:
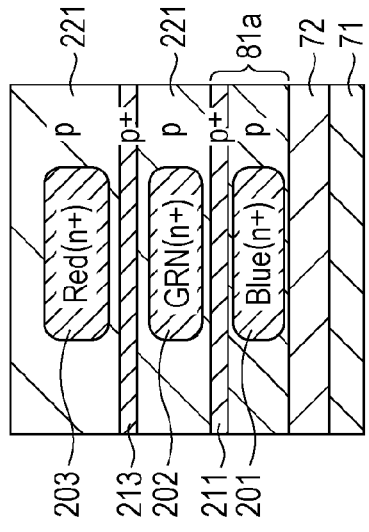
FIGS. 18A to 18C are diagrams illustrating a second manufacturing method for forming three photoelectric conversion layers.
Figure 18B:
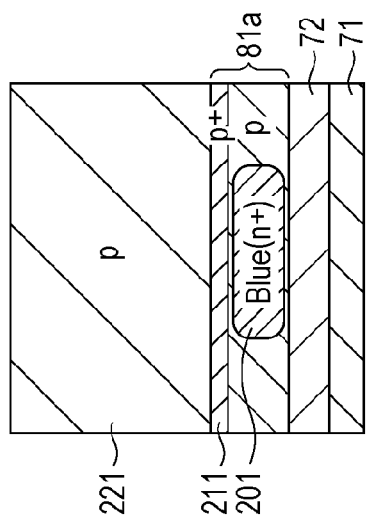
Figure 18C:
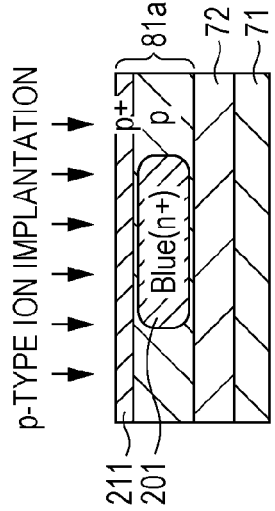

FIGS. 18A to 18C illustrate a second manufacturing method for forming three photoelectric conversion layers in the semiconductor substrate 17.

A process up to the formation of a photoelectric conversion layer 201 for blue illustrated in FIG. 18A is similar to the method described with reference to FIG. 17A.

Then, as illustrated in FIG. 18B, epitaxial growth is performed to additionally form an n-type semiconductor layer 221 until a thickness enough to form a photoelectric conversion layer 202 for green and a photoelectric conversion layer 203 for red can be obtained, and p-type impurities are ion-implanted into the n-type semiconductor layer 221. Thus, the semiconductor layer 221 is formed as a low-concentration p-type impurity region.

Subsequently, the photoelectric conversion layer 202 for green, a p-type high-concentration impurity region 213, and the photoelectric conversion layer 203 for red are formed in sequence using a method similar to the method described with reference to FIGS. 17C to 17F. Thus, as illustrated in FIG. 18C, the photoelectric conversion layers 201, 202, and 203 for three colors are formed.

Accordingly, it is possible to form three photoelectric conversion layers in the semiconductor substrate 17 using a method of performing epitaxial growth to increase the thickness of a semiconductor layer. The method of performing epitaxial growth to increase the thickness of a semiconductor layer and forming a plurality of photoelectric conversion layers in the semiconductor substrate 17 can also be applied to a front-illuminated solid-state imaging device as well as the back-illuminated solid-state imaging device described above.

In the foregoing embodiments, first, high-concentration impurities are ion-implanted into the semiconductor layer 81a or 111 formed in advance on the SOI substrate 80 or 112, and the connection portion 23 and the n-type semiconductor region 19 are formed. Second, epitaxial growth is performed to additionally form the semiconductor layer 81b. Therefore, a high-concentration impurity region having a peak Rp of the impurity concentration distribution can be formed in a shallow region from the light incident surface of the semiconductor layer.

In the foregoing embodiments, the SOI substrate (80, 112) is used as a semiconductor substrate, by way of example. In place of the BOX layer 72, a dope layer of boron (B), antimony (Sb), or the like may be used. Alternatively, a dope layer may not be provided.

In the foregoing embodiments, furthermore, the connection portion 23 and the n-type semiconductor region 19 have been described as examples of high-concentration impurity regions formed in a shallow region from the light incident surface of the semiconductor layer. It is to be understood that the method of forming such concentration impurity regions may also be applied to any other region. For example, the method can also be applied to form the connection portion 141 (FIG. 15) to be connected to the upper electrode 34a and contacts in a peripheral circuit other than the pixel region 3.

In the foregoing embodiments, furthermore, electrons are signal charges, with the first conductivity type being p type and the second conductivity type being n type. However, the present technology can also be applied to a solid-state imaging device in which holes are signal charges. That is, the first conductivity type is n type, the second conductivity type is p type, and the semiconductor regions described above can be semiconductor regions having conductivity types opposite to those described above.

Furthermore, the present technology is not limited to a solid-state imaging device that detects a distribution of the amount of incident visible light and that captures the distribution as an image, but can also be applied to a solid-state imaging device that captures, as an image, a distribution of the amount of incident infrared radiation, x-ray radiation, particles, or the like. In a broad sense, the present technology can also be applied to general solid-state imaging devices (physical quantity distribution detectors) configured to detect a distribution of any other physical quantity such as pressure or capacitance and to capture an image, such as a fingerprint detection sensor.

Further, the present technology is not limited to a solid-state imaging device configured to sequentially scan unit pixels of a pixel unit on a row-by-row basis and to read a pixel signal from each unit pixel. The present technology can also be applied to an X-Y addressing solid-state imaging device configured to select an arbitrary pixel on a pixel-by-pixel basis and to read a signal from the selected pixel on a pixel-by-pixel basis. The solid-state imaging device used herein may be formed as one chip or may be formed in a module having an imaging function in which a pixel unit and a signal processing unit or an optical system are collectively assembled into a package.

Additionally, the present technology may not necessarily be applied to a solid-state imaging device, and can also be applied to an image capturing apparatus. The term "image capturing apparatus", as used herein, refers to a camera system such as a digital still camera or a video camera, or an electronic apparatus having an image capturing function, such as a mobile phone. The module-like structure described above, which is mounted in an electronic apparatus, that is, a camera module, may also refer to as an image capturing apparatus.

3. Third Embodiment

Next, a description will be made of an electronic apparatus according to a third embodiment.

Figure 19:
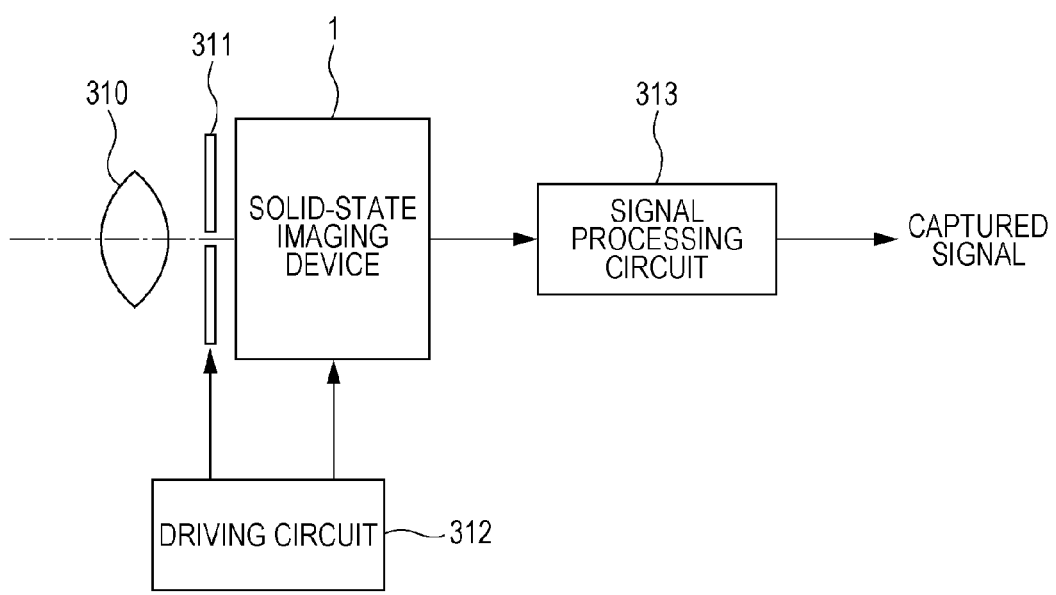
FIG. 19 is a schematic configuration diagram of an electronic apparatus according to a third embodiment of the present technology.

FIG. 19 is a schematic configuration diagram of an electronic apparatus 300 according to a third embodiment of the present technology.

The electronic apparatus 300 illustrated in FIG. 19 includes the solid-state imaging device 1 according to the first embodiment described above, an optical lens 310, a shutter device 311, a driving circuit 312, and a signal processing circuit 313. In the electronic apparatus 300, the solid-state imaging device 1 is used as an electronic apparatus (camera).

The optical lens 310 directs image light (or incident light) from an object onto an imaging surface of the solid-state imaging device 1 to form an image. Thus, signal charges are accumulated in the solid-state imaging device 1 for a certain period. The shutter device 311 controls the period during which the solid-state imaging device 1 is irradiated with light and the period during which the solid-state imaging device 1 is shielded from light. The driving circuit 312 supplies a drive signal for controlling the transfer operation of the solid-state imaging device 1 and the shutter operation of the shutter device 311. The signal transfer of the solid-state imaging device 1 is performed in accordance with the drive signal (timing signal) supplied from the driving circuit 312. The signal processing circuit 313 performs various kinds of signal processing. A captured signal obtained by performing signal processing is stored in a storage medium such as a memory, or is output to a monitor.

In the electronic apparatus 300 according to this embodiment, the solid-state imaging device 1 can reduce the pixel size and increase the transfer efficiency, resulting in improved pixel characteristics. The electronic apparatus 300 including the solid-state imaging device 1 is not limited to a camera, and may be a digital still camera or an image capturing apparatus such as a camera module used for mobile devices such as mobile phones.

Embodiments of the present technology are not limited to the foregoing embodiments, and a variety of modifications can be made without departing from the scope of the present technology.

The present technology also encompasses the following embodiments:

(1) A solid-state imaging device including:
a semiconductor substrate having a back side and a front side, the back side being a light incident surface, the front side being a circuit-forming surface;
a connection portion connected to a contact plug that transfers signal charges generated on the back side of the semiconductor substrate into the semiconductor substrate, the connection portion having a peak of an impurity concentration distribution near an interface of the semiconductor substrate on the back side of the semiconductor substrate; and
one or more first photoelectric conversion units formed in the semiconductor substrate.

(2) The solid-state imaging device according to (1) above, further including:
a second photoelectric conversion unit for a first color stacked on the semiconductor substrate on the light incident surface side of the semiconductor substrate, the second photoelectric conversion unit being sandwiched between a lower electrode and an upper electrode,
wherein the one or more first photoelectric conversion units include a photoelectric conversion unit for a second color and a photoelectric conversion unit for a third color, the photoelectric conversion unit for the second color and the photoelectric conversion unit for the third color being stacked on top of one another in a depth direction of the semiconductor substrate, and
wherein the signal charges are generated in the second photoelectric conversion unit for the first color, and are supplied to the connection portion.

(3) The solid-state imaging device according to (1) or (2) above, wherein
the connection portion is formed by selectively etching a first region of a semiconductor layer having a first thickness to a second thickness and then ion-implanting impurities into the first region, and
after ion implantation, the first region etched to the second thickness is backfilled to the first thickness by epitaxial growth, and then epitaxial growth is performed to increase the thickness of the semiconductor layer having the first thickness to a third thickness to obtain the semiconductor substrate.

(4) The solid-state imaging device according to (3) above, wherein
after the first region is backfilled to the first thickness by epitaxial growth, one of the first photoelectric conversion units is formed in a second region at a horizontal position different from a horizontal position of the connection portion in the semiconductor layer having the first thickness.

(5) The solid-state imaging device according to any of (1) to (4) above, wherein
the connection portion is formed by ion-implanting impurities into a first region of a semiconductor layer having a first thickness,
after ion implantation, epitaxial growth is performed to increase the thickness of the semiconductor layer having the first thickness to a second thickness, and
epitaxial growth is further performed to increase the thickness of the semiconductor layer having the second thickness to a third thickness to obtain the semiconductor substrate.

(6) The solid-state imaging device according to (5) above, wherein
after epitaxial growth is performed to increase the thickness of the semiconductor layer to the second thickness, one of the first photoelectric conversion units is formed in a second region at a horizontal position different from a horizontal position of the connection portion in the semiconductor layer having the second thickness.

(7) The solid-state imaging device according to any of (1) to (6) above, wherein
the peak of the impurity concentration distribution is within 100 nm from the interface of the semiconductor substrate on the back side of the semiconductor substrate.

(8) A method for manufacturing a solid-state imaging device, including:
forming a connection portion by ion-implanting impurities into a first region of a semiconductor substrate having a first thickness, the connection portion being connected to a contact plug that transfers signal charges generated on a back side of the semiconductor substrate into the semiconductor substrate, the back side of the semiconductor substrate being a light incident surface, the connection portion having a peak of an impurity concentration distribution near an interface of the semiconductor substrate on the back side of the semiconductor substrate;
performing epitaxial growth to increase the thickness of the semiconductor substrate having the first thickness to a second thickness;
forming a first photoelectric conversion layer in a second region at a horizontal position different from a horizontal position of the connection portion in the semiconductor substrate having the second thickness, the first photoelectric conversion layer being configured to photoelectrically convert light having a first wavelength; and
further performing epitaxial growth to increase the thickness of the semiconductor substrate having the second thickness to a third thickness.

(9) The method according to (8) above, wherein
the forming of the connection portion includes forming the connection portion by ion-implanting impurities into the first region of the semiconductor substrate, the first region being selectively etched from a fourth thickness larger than the first thickness so as to have the first thickness, and
the performing of epitaxial growth includes performing epitaxial growth, after ion implantation, to backfill the etched first region by a thickness equal to the first thickness to increase the thickness of the first region to the second thickness.

(10) The method according to (8) or (9) above, further including:
forming a second photoelectric conversion layer at a position in a depth direction that is more distant from the back side of the semiconductor substrate having the third thickness than the first photoelectric conversion layer, the second photoelectric conversion layer being configured to photoelectrically convert light having a second wavelength.

(11) An electronic apparatus including:
a solid-state imaging device that light collected by an optical lens enters; and
a signal processing circuit configured to process an output signal of the solid-state imaging device,
the solid-state imaging device including
a semiconductor substrate having a back side and a front side, the back side being a light incident surface, the front side being a circuit-forming surface,
a connection portion connected to a contact plug that transfers signal charges generated on the back side of the semiconductor substrate into the semiconductor substrate, the connection portion having a peak of an impurity concentration distribution near an interface of the semiconductor substrate on the back side of the semiconductor substrate, and
one or more first photoelectric conversion units formed in the semiconductor substrate.

The present disclosure contains subject matter related to that disclosed in Japanese Priority Patent Application JP 2011-143581 filed in the Japan Patent Office on Jun. 28, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate having a back side and a front side, the back side being a light incident surface, the front side being a circuit-forming surface;
an opening formed in a region of a semiconductor layer of the semiconductor substrate;
a connection portion formed in the region of the semiconductor layer, the connection portion connected to a contact plug that transfers signal charges generated on the back side of the semiconductor substrate into the semiconductor substrate, the connection portion having a peak of an impurity concentration distribution near an interface of the semiconductor substrate on the back side of the semiconductor substrate;
a first epitaxial layer formed in the region of the semiconductor layer to completely fill the opening;
a second epitaxial layer formed on the entire top surface of the semiconductor substrate; and
one or more first photoelectric conversion units formed in the semiconductor substrate.

2. The solid-state imaging device according to claim 1, further comprising:
a second photoelectric conversion unit for a first color stacked on the semiconductor substrate on the light incident surface side of the semiconductor substrate, the second photoelectric conversion unit being sandwiched between a lower electrode and an upper electrode,
wherein the one or more first photoelectric conversion units include a photoelectric conversion unit for a second color and a photoelectric conversion unit for a third color, the photoelectric conversion unit for the second color and the photoelectric conversion unit for the third color being stacked on top of one another in a depth direction of the semiconductor substrate, and wherein the signal charges are generated in the second photoelectric conversion unit for the first color, and are supplied to the connection portion.

3. The solid-state imaging device according to claim 1, wherein the connection portion is formed by selectively etching the region of the semiconductor layer having a first thickness to a second thickness and ion-implanting impurities into the region, and after ion implantation, the region etched to the second thickness is backfilled to the first thickness by epitaxial growth, and wherein epitaxial growth is performed to increase thickness of the semiconductor layer having the first thickness to a third thickness to obtain the semiconductor substrate.

4. The solid-state imaging device according to claim 3, wherein after the region is backfilled to the first thickness by epitaxial growth, one of the first photoelectric conversion units is formed in another region at a horizontal position different from a horizontal position of the connection portion in the semiconductor layer having the first thickness.

5. The solid-state imaging device according to claim 1, wherein the peak of the impurity concentration distribution is within 100 nm from the interface of the semiconductor substrate on the back side of the semiconductor substrate.

6. An electronic apparatus comprising:

a solid-state imaging device configured to receive light collected by an optical lens; and a signal processing circuit configured to process an output signal of the solid-state imaging device, the solid-state imaging device including:

a semiconductor substrate having a back side and a front side, the back side being a light incident surface, the front side being a circuit-forming surface, an opening formed in a region of a semiconductor layer of the semiconductor substrate, a connection portion formed in the region of the semiconductor layer, the connection portion connected to a contact plug that transfers signal charges generated on the back side of the semiconductor substrate into the semiconductor substrate, the connection portion having a peak of an impurity concentration distribution near an interface of the semiconductor substrate on the back side of the semiconductor substrate, a first epitaxial layer formed in the region of the semiconductor layer to completely fill the opening, a second epitaxial layer formed on the entire top surface of the semiconductor substrate, and one or more first photoelectric conversion units formed in the semiconductor substrate.

* * * * *